(12) United States Patent
Taylor, Jr.

(10) Patent No.: US 6,485,248 B1
(45) Date of Patent: Nov. 26, 2002

(54) MULTIPLE WAFER LIFT APPARATUS AND ASSOCIATED METHOD

(75) Inventor: William N. Taylor, Jr., Dublin, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/686,211

(22) Filed: Oct. 10, 2000

(51) Int. Cl.$^7$ .............................. B65H 85/00; B65G 1/10
(52) U.S. Cl. .................. 414/672; 414/331.01; 414/217; 414/935; 414/936
(58) Field of Search ................................ 414/217, 222, 414/331.01, 331.04, 331.07, 331.14, 331.18, 749.5, 754, 757, 779, 935, 936, 939, 816, 940, 491, 672

(56) References Cited

U.S. PATENT DOCUMENTS

| | | | | |
|---|---|---|---|---|
| 5,100,502 A | * | 3/1992 | Murdoch et al. | 156/643 |
| 5,879,128 A | * | 3/1999 | Tietz et al. | 414/757 |
| 5,899,653 A | * | 5/1999 | Brodine | 414/222 |
| 6,151,446 A | * | 11/2000 | Hunter et al. | 392/416 |
| 6,190,113 B1 | * | 2/2001 | Bui et al. | 414/672 |
| 6,309,163 B1 | * | 10/2001 | Nering | 414/331.01 |

* cited by examiner

Primary Examiner—Eileen D. Lillis
Assistant Examiner—Charles Fox
(74) Attorney, Agent, or Firm—Moser, Patterson & Sheridan

(57) ABSTRACT

An apparatus and associated method for transporting a first substrate and a second substrate relative to a cell. The cell contains a pedestal that is configured to interact with a single substrate. When swapping wafers in a cell, a first substrate is displaced from the pedestal to a remote location and a second substrate is inserted into the cell and onto the pedestal. The first substrate is then removed from the cell.

20 Claims, 13 Drawing Sheets

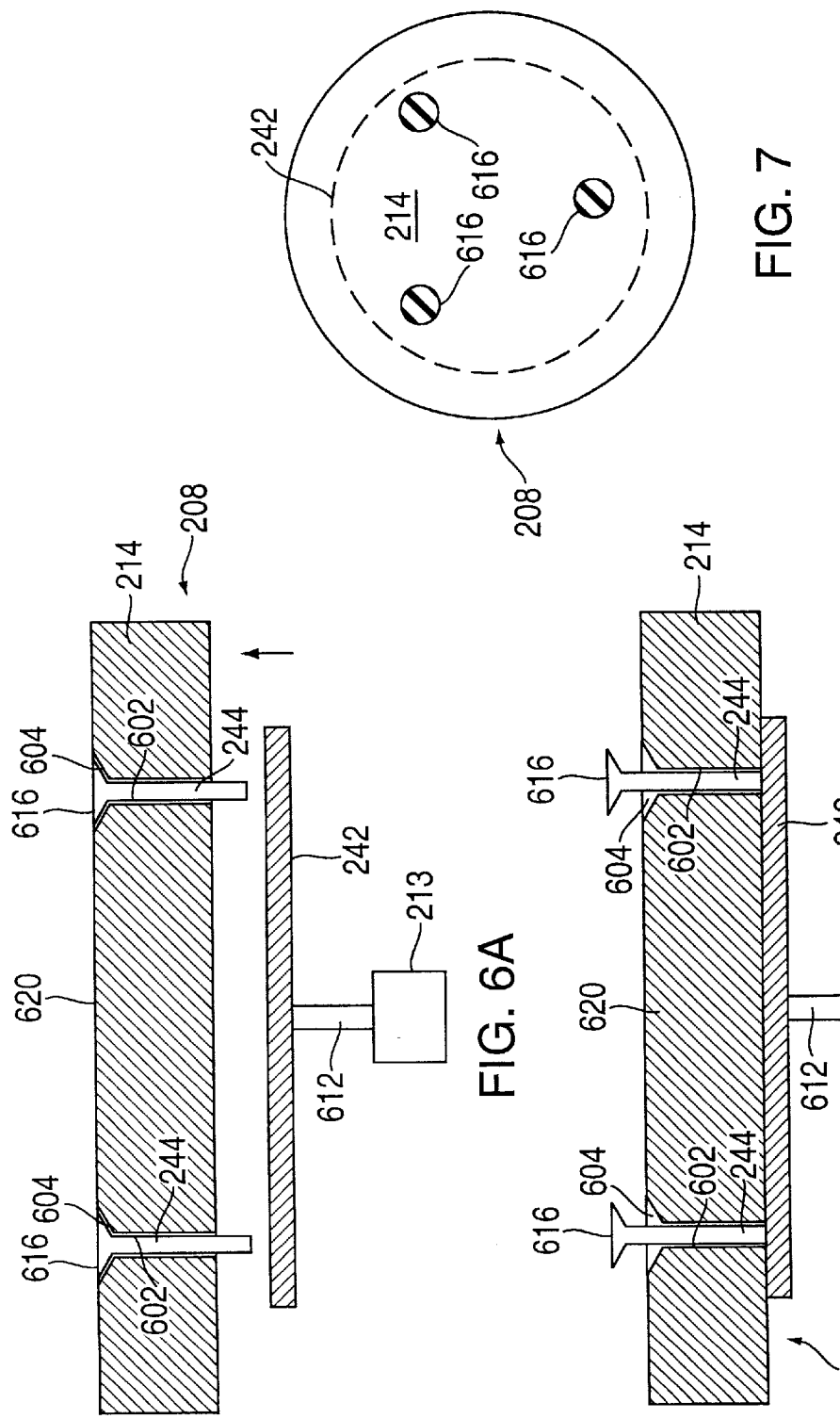

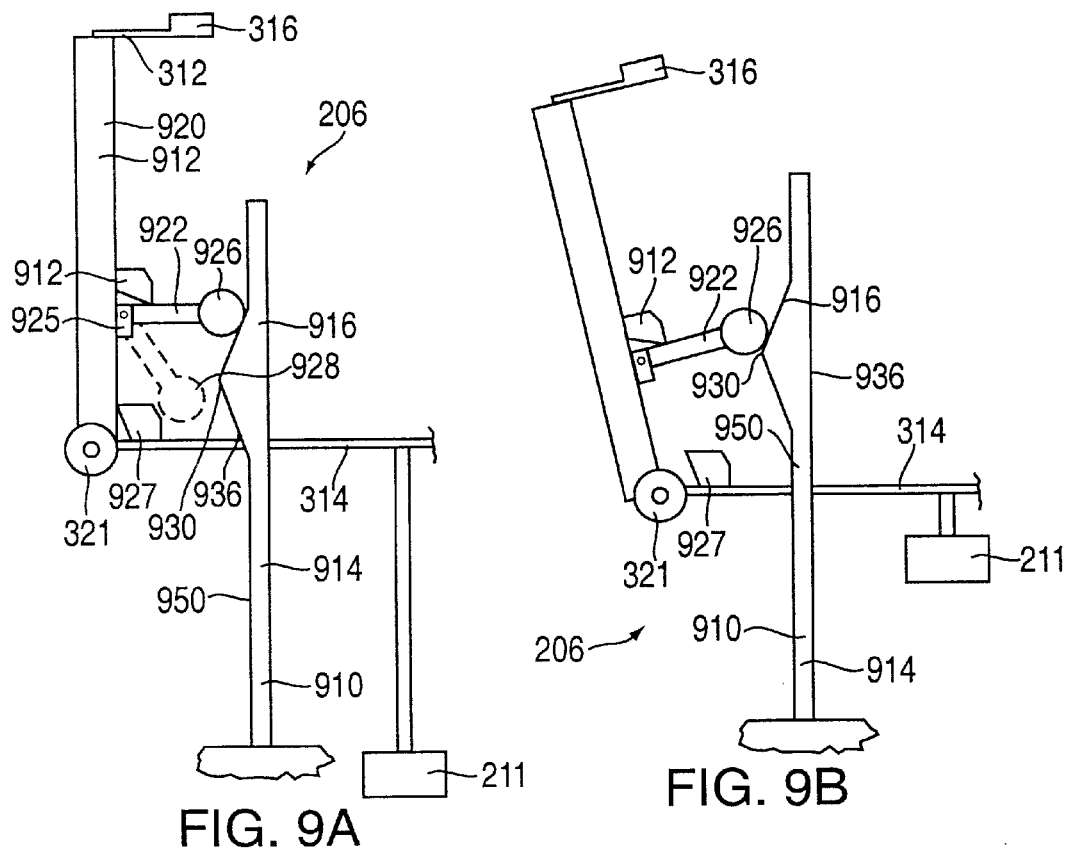
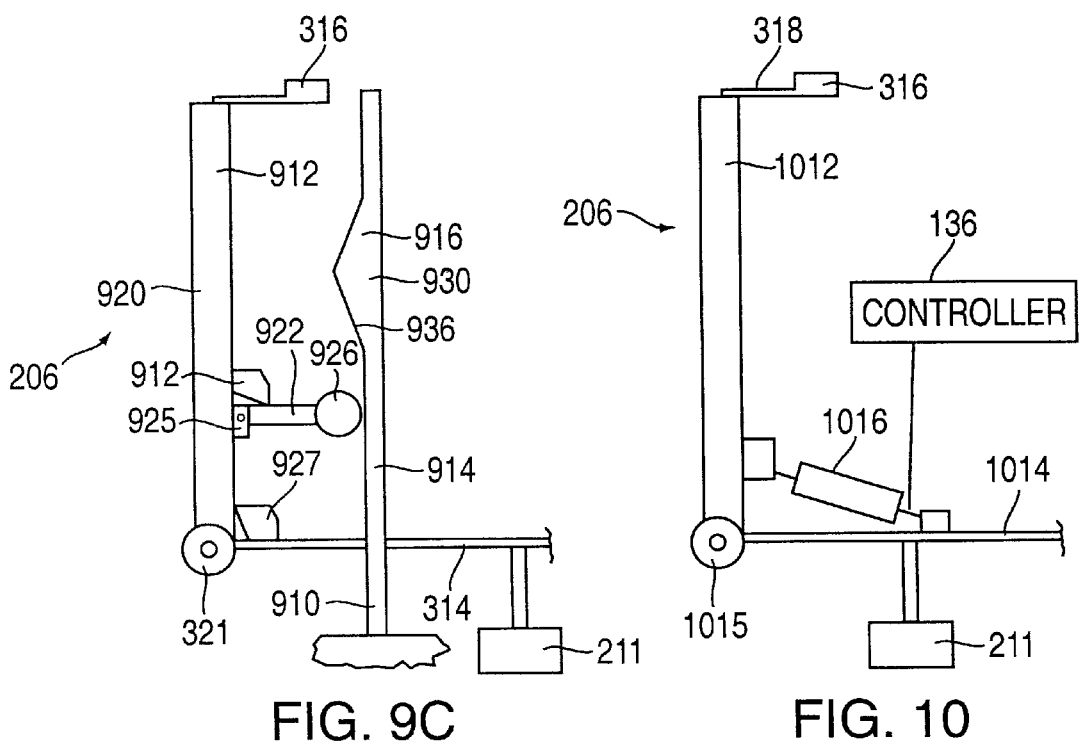
FIG. 9A  FIG. 9B  FIG. 9C  FIG. 10

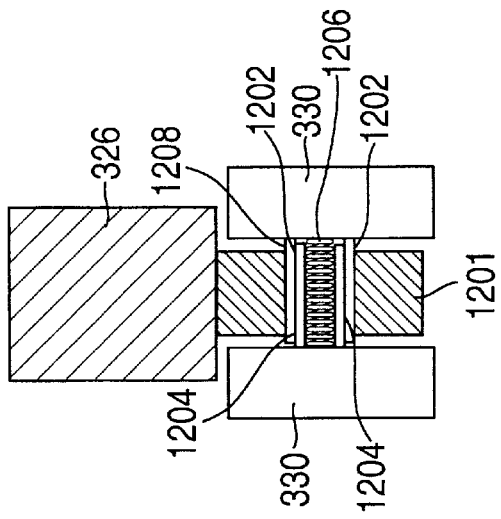
FIG. 12
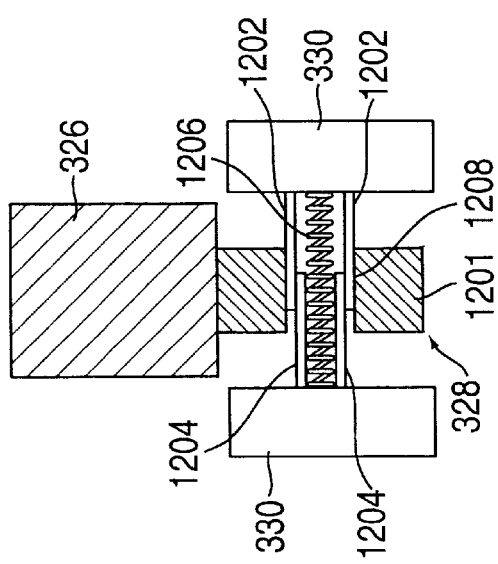
FIG. 13
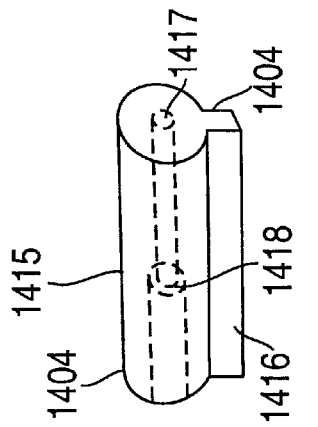
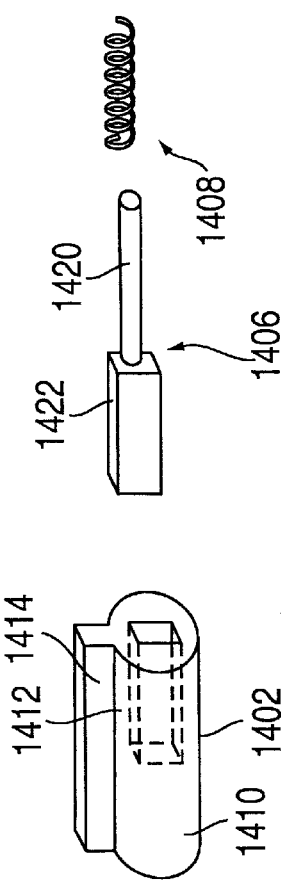
FIG. 14

MULTIPLE WAFER LIFT APPARATUS AND ASSOCIATED METHOD

BACKGROUND OF THE DISCLOSURE

1. Field of the Invention

The invention relates to a substrate lift for semiconductor substrates. More particularly, the invention relates to a substrate lift that can simultaneously support multiple substrates in a single cell.

2. Description of the Background Art

Semiconductor substrates or wafers are processed to produce integrated circuits using a series of processes. Each of these processes are performed in a distinct type of process cell. Other cells, known as metrology cells, are used to measure substrates. An assemblage of cells served by at least one substrate transport robot is known as a cluster tool. The substrate transfer robot resides in a transfer cell that is typically connected to each of the plurality of process cells such that the robot can access a semiconductor substrate positioned in each one of the process cells, and the robot can transfer the substrate between the various cells.

Some substrate transfer robots are configured to contain one robot blade that can handle one substrate at a time. Other substrate transfer robots have two back-to-back robot arms attached to a single robot hub. Each robot arm supports a distinct robot blade. Robot blades, known alternatively as end effectors, are those portions of the robot that support the substrate (from above, below, or other relative attitudes). In the back-to-back robot arm configuration, when a first end effector is moved in a process cell to interact with a substrate, the second end effector is constrained to be oriented 180 degrees away from the first end effector. When the second end effector is constrained in a position as a result of the first substrate interacting with a substrate, the second end effector is typically not positioned to perform any useful process or transfer on any substrate. The second end effector is thus limited to holding a substrate (or not holding any substrate) until the first end effector completes a substrate transfer.

Each cell is typically configured to hold one substrate at a time. If a second substrate is inserted into a cell that contains a first substrate, the second substrate, or the end effector supporting the second substrate, would collide with or interfere with the first substrate. Swapping the substrates in a cell thus requires a robot to remove the first substrate from the cell before the second substrate is inserted into the cell. As the first substrate is removed from the cell to permit insertion of the second substrate into the cell, the first substrate is temporarily stored somewhere remote from the process cell, and the second substrate to permit the robot end effector to be used to insert the second substrate into the cell. The above described substrate swapping not only necessitates challenging robot motion, but provides a bottleneck for substrate processing that reduces substrate throughput.

Therefore, a need exists in the art for an apparatus or method that increases throughput by increasing the number of substrates that can be simultaneously held within a cell so the substrates can be swapped. A need also exists for a single robot that can swap a substrate to be inserted into a cell with a substrate already in the cell.

SUMMARY OF THE INVENTION

An apparatus and associated method transporting a first substrate and a second substrate relative to a cell. The cell contains a pedestal that is configured to interact with a single substrate when swapping substrates, a first substrate is displaced from the pedestal to a remote location using a two substrate lift device and a second substrate is inserted into the cell and onto the pedestal. The present invention is especially applicable in cells in which substrates are displaced using a robot, and may be used in a variety of process cells and metrology cells.

BRIEF DESCRIPTION OF THE DRAWINGS

FIGS. 6A and 6B show a side cross sectional views of a pedestal including one embodiment of a second substrate lift, the second substrate lift is positioned in a lowered position in FIG. 6A and in a raised position in FIG. 6B;

FIG. 7 shows a top view of the pedestal of FIG. 6A;

FIG. 9A, FIG. 9B, and FIG. 9C show side cross sectional views of an alternate embodiment of first substrate lift; in FIG. 9A the support element is in the upright position while the first substrate lift is in its raised position, in FIG. 9B the support element is in the outwardly displaced position while the first substrate lift is in a middle in FIG. 9C the support element is in an upright position while the first substrate lift is in its lowered position;

FIG. 10 is yet another embodiment of first substrate lift;

FIG. 12 is a top view of one embodiment of a guide member of FIG. 4A that has its biased guide rollers in their extended positions;

FIG. 13 is the guide member of FIG. 12 with the guide rollers in their retracted position; and FIG. 14 shows an exploded view of one embodiment of the biased pivoting connection of FIG. 4A.

To facilitate understanding, identical reference numerals have been used, where possible, to designate identical elements that are common to the figures.

DETAILED DESCRIPTION

After considering the following description, those skilled in the art will clearly realize that the teachings of the invention can be readily utilized in robotic systems.

More particularly, the present invention is directed to a multiple substrate lift device in which more than one substrate can be simultaneously positioned relative to a substrate in a cell. The term "cell" used herein can relate to a process cell, a metrology cell, or any other known type of cell or chamber associated with substrate processing, testing, transfer, or positioning.

1. Cell Configuration

Figure 1:
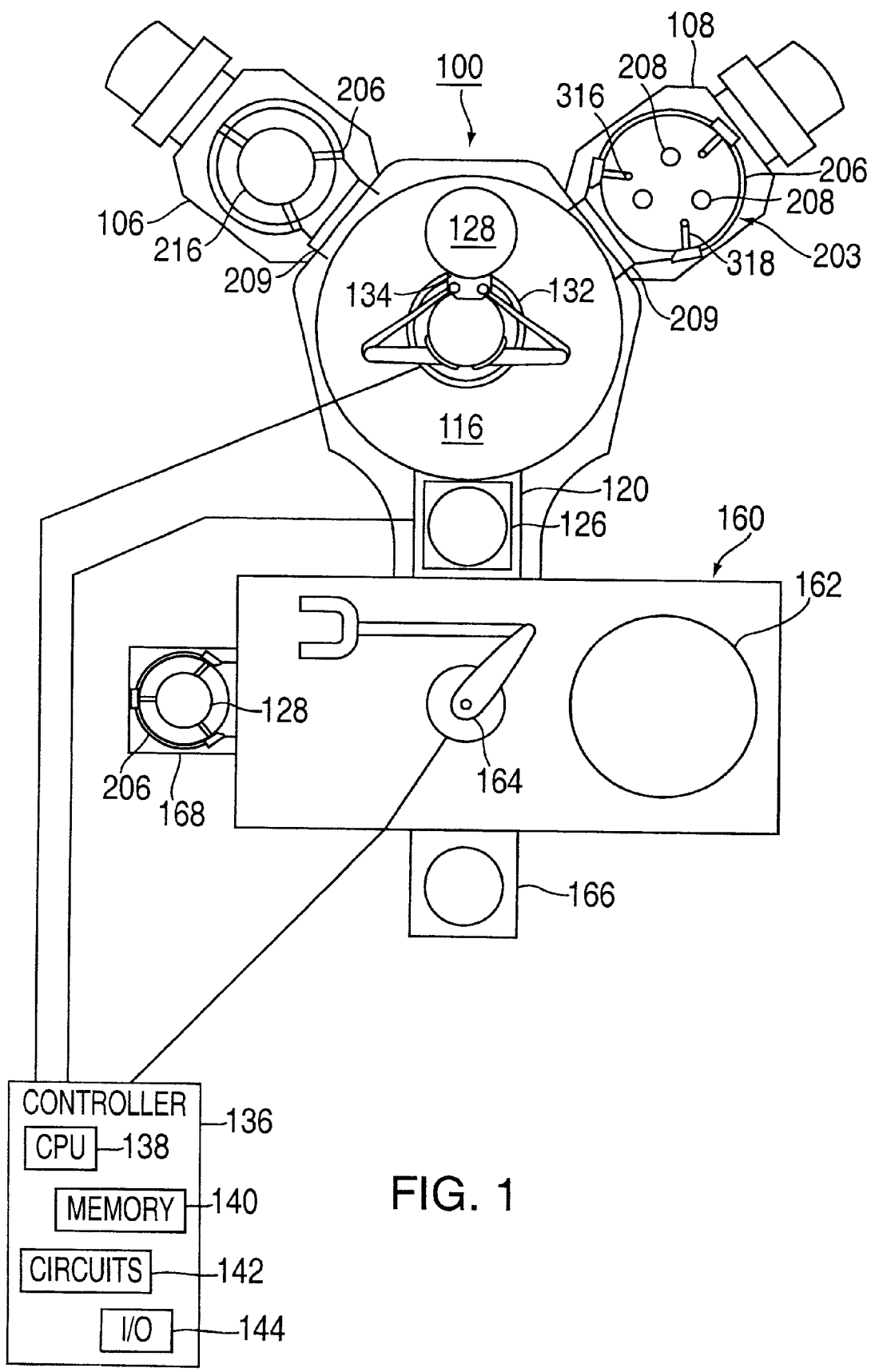
FIG. 1 shows a cluster tool comprising a plurality of cells and multiple substrate lift devices in accordance with one embodiment of the invention.
Figure 2:
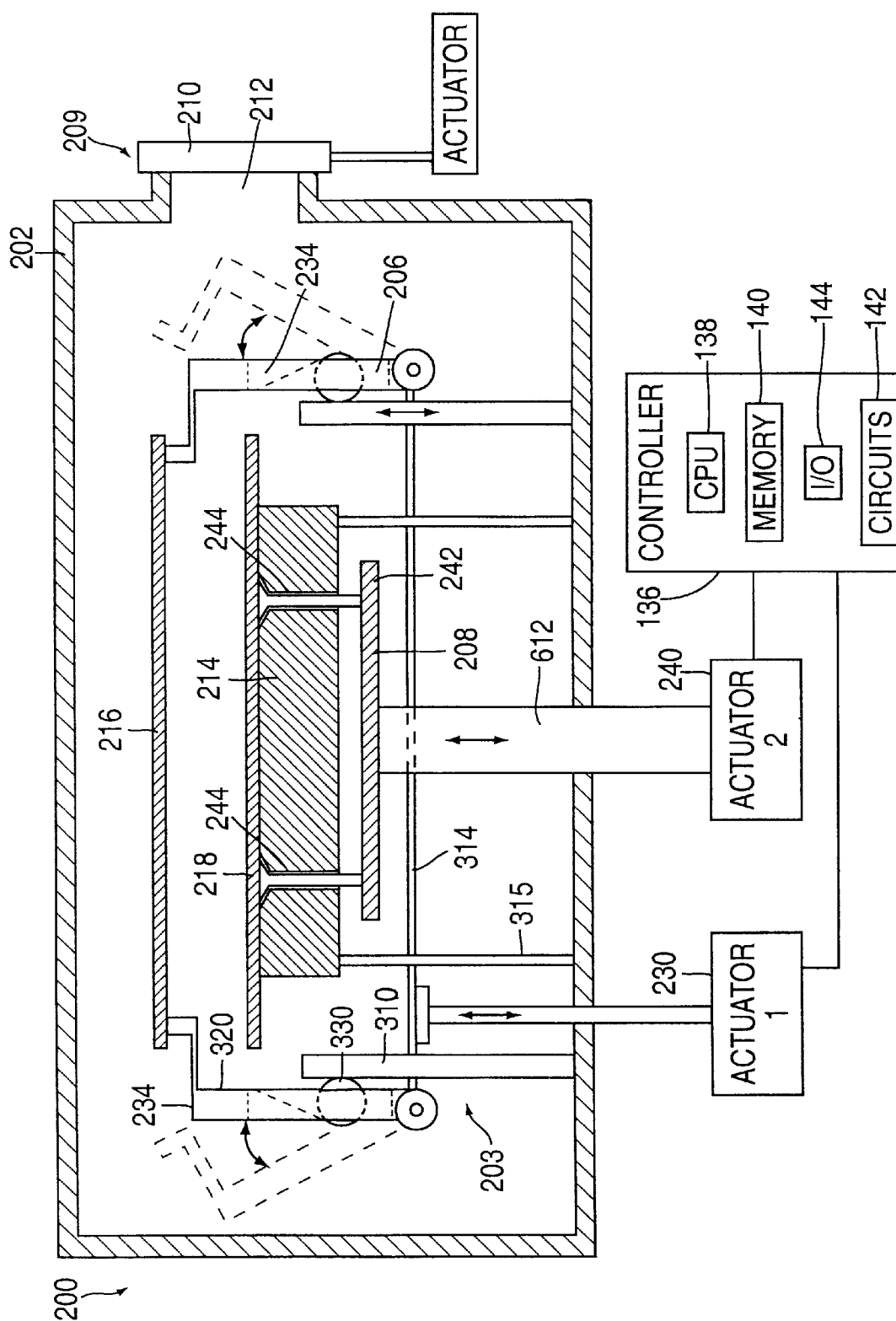
FIG. 2 shows one embodiment of a process cell shown in FIG. 1.

FIG. 1 depicts a top view of a cluster tool 100 comprising multiple process cells 106 and 108. Each process cell includes a multiple substrate lift device 203. FIG. 2 depicts a side view of one of the process cells 200 of FIG. 1 including a multiple substrate lift device 203.

The cluster tool 100 comprises the two process cells 106 and 108, a transfer cell 116, a load lock cell 120, a substrate handling portion 160, and a metrology cell 168.

Each process cell 106, 108 may be used in one or more distinct types, stages, or phases of semiconductor substrate processing. Each process cell 106, 108 comprises a first substrate lift 206 and a second substrate lift 208.

The substrate handling portion 160 comprises a handling platform 162, an atmospheric robot 164, a substrate loading pod 166, and a metrology cell 168. In the substrate handling portion 160, the atmospheric robot 164 transfers substrates under the control of controller 136 between the handling platform 162, the substrate loading pod 166, the metrology cell 168, and the load lock 120. The contents of the substrate handling portion 160 are typically operated at atmospheric pressure. The substrate handling portion 160 is used to insert the substrates into the cluster tool, remove the substrates from the cluster tool, and perform the metrology functions.

The metrology cell 168 measures, inspects, and/or tests substrates. Metrology cells typically use optical systems such as lasers to measure the dimensions and electronic characteristics of the substrates. A metrology cell may also utilize the multiple substrate lift device of the type described below.

The substrates 128 can be transferred between the substrate handling portion 160 and the transfer cell 116 via a cassette 126 (using the atmospheric robot 164) that is located within the load lock cell 120. The cassette 126 is capable of containing a plurality of substrates in vertically arranged cassette shelves. The cassette 126 is vertically adjustable to align one cassette shelf (or a substrate contained within the cassette shelf) with a robot end effector (also known as a robot blade). The robot 132 transports the substrates 128, typically one at a time, from the cassette 126 to any of the two process cells 106 or 108. Any number of cells can be provided in the cluster tool. Individual substrates are carried upon an end effector (also called a robot blade) 134 that is located at the distal end of the robot 132.

The controller 136 shown in FIGS. 1 and 2 controls the processing, substrate transfer, testing performed within the cluster tool 100, and controls the operation of the robots 132 and 164. The controller 136 comprises a microprocessor 138 (CPU), a memory 140 for storing the control routines, and support circuits 142 (such as power supplies, clock circuits, cache, etc.). The controller 136 also comprises input/output peripherals (I/O) 144 such as a keyboard, mouse, and display. The controller 136 is a general-purpose computer that is programmed to perform the sequencing and scheduling operations that facilitate substrate processing and transport. The software routines that control the cluster tool are stored in memory 140 and executed by microprocessor 138 to facilitate operation of the cluster tool.

The memory 140 includes random access memory (RAM) and read only memory (ROM) that together store the computer programs, operands, operators, dimensional values, system processing temperatures and configurations, and other parameters that control the electroplating operation. The bus (not shown) provides for digital information transmissions between CPU 138, circuit portion 142, memory 140, and I/O 144. The bus also connects I/O 144 to the portions of the cluster tool 100 that either receive digital information from, or transmit digital information to, controller 136.

I/O 264 provides an interface to control the transmissions of digital information between each of the components in controller 136. I/O 144 also provides an interface between the components of the controller 136 and different portions of the cluster tool 100. Circuit portion 265 comprises all of the other user interface devices (such as display and keyboard), system devices, and other accessories associated with the controller 136. While one embodiment of digital controller 136 is described herein, other digital controllers as well as analog controllers could function well in this application, and are within the intended scope of the invention. It is contemplated that some of the process steps discussed herein as software processes may be implemented within hardware, e.g., as circuitry that cooperate with the microprocessor to perform various process steps.

The embodiment of cell 200 shown in FIG. 2 comprises a cell enclosure 202, a pedestal 214, a multiple substrate lift device 203, and the controller 136. The multiple substrate lift device 203 comprises the first substrate lift 206, the second substrate lift 208, a first actuator 230, and a second actuator 240. The first substrate lift 206 is configured to lift a substrate 216 within the cell 200 to a level wherein another substrate 218 may be inserted (via the end effector 134 attached to the robot 132) into the cell 200 under the first substrate 216. The first actuator 230 selectively displaces the first substrate lift 206 under the control of the controller 136. The second substrate lift 208 is configured to raise a substrate to a sufficient level so an end effector 134 can be positioned under (or removed from under) the substrate. A second actuator 240 selectively displaces the second substrate lift 208 under the control of the controller 136.

In this embodiment, the pedestal 214 is shown as a platform that a substrate rests on during processing. The term "pedestal" is intended to relate to any structure that holds a substrate within a cell. As such, any pedestal, chuck, spindly-armed structure, etc. that holds a substrate in an upright or inverted position during processing, measuring, testing, or displacement of the substrate is a pedestal.

The multiple substrate lift device 203 may be applied to process cells that are capable of utilizing robots such as pressurized vapor deposition (PVD), chemical vapor deposition (CVD), etching, deposition, or any other known type of process cells or chambers, as well as metrology stations. The multiple substrate lift device 203 is configured to interact with a single pedestal 214. The pedestal 214 is typically configured to support a single substrate during processing. Certain embodiments of the multiple substrate lift device 203 allows for multiple substrates to be contained within the cell 202 simultaneously. The containing of multiple substrates within the cell enables "switching" of substrates held by a robot as both cells that are switched are maintained within the cell.

The first substrate lift 206 and the second substrate lift 208 can each support a distinct substrate concurrently within either a single cell. The multiple substrate lift device 203 allows a robot 132 to insert a second substrate in the cell while a first substrate is already contained in the cell. The robot then removes the first substrate from the cell. As such, the robot does not have to temporarily position the second substrate at a remote location when the robot is removing the first substrate located in the cell. The substrate lift device 203 provides for temporary positioning of two substrates within the same cell to enhance throughput of the substrates through the cluster tool.

The cell 200 shown in FIG. 2 represents one embodiment of the process cells 106 and 108 of the cluster tool 100, or alternatively the metrology cell 168. The multiple substrate lift device 203 is used in unloading of a first semiconductor substrate that has completed processing within a cell onto a robot end effector or robot blade, and the concurrent loading of a second semiconductor substrate that is to be processed within the same cell from the same robot end effector or robot blade. This loading and unloading of semiconductor substrates can be performed using a robot 132 having a single end effector of the type shown in FIG. 1. Certain embodiments of the first substrate lift of the multiple substrate lift device are detailed in FIGS. 3A, 3B, 4A, 4B, 5, 9A, 9B, 9C, and 10. The multiple substrate lift device 203 is configured to increase robot throughput to and from a cell by increasing the speed at which substrates can be swapped within a single cell.

FIG. 2 shows a side view of a cell 200 including one embodiment of multiple substrate lift device 203 of the present invention. The multiple substrate lift device 203 simultaneously positions two semiconductor substrates in the cell 200. Therefore, a single cell simultaneously contains both a processed substrate that is to be transferred from the cell 200 on the first substrate lift 206 and a new substrate that is the next substrate to be processed in the cell on the second substrate lift 208.

The first substrate lift 206 comprises the first substrate actuator 230, a platform element 314, and a plurality of support elements 234. A plurality (preferably three) of support elements 234 are outwardly rotatably mounted to the platform element 314, and are preferably used to provide a stable structure. Each support element 234 is rotatably displaceable between an upright position (shown in solid) and an outwardly displaced position (shown in dotted lines) under the control of the controller 136. The first substrate actuator 230 contains a portion that extends about the periphery of the pedestal 214, so the first substrate actuator may vertically move while extending around the second substrate actuator in a manner to support and raise a substrate above the pedestal.

The first substrate actuator 230 applies motion to the platform element 314. Actuation of the first substrate actuator 230 thus raises or lowers the platform element 314 and the connected support elements 234, that in turn lifts a substrate supported on the support element 234 of the first substrate actuator. While the first actuator 230 and the second actuator 240 are shown outside of the cell 200, the positioning of the substrate actuators is a design choice. For example, one or both of the substrate actuators 230, 240 may in an alternate embodiment be positioned within the cell 200 and attached to a cell wall, cell base, or other structure.

The second substrate lift 208 comprises a second substrate actuator 240, a platform 242, and a plurality of (preferable three) elongated pins 244. In one embodiment, each elongated pin 244 displacably extends through the pedestal 214 in a manner that the elongated pin may vertically travel through the pedestal to contact a lower surface of a substrate. The second actuator 240 is attached to the platform 242. Actuation of the second substrate actuator drive 240 thus raises or lowers the platform 242 and the elongated pins 244. The elongated pins 244 may be raised in unison by the second actuator 240 raising the platform 244, thereby the pins support the substrate above the pedestal. The elongated pins 244 may be retracted by the second actuator 240 lowering the platform 244 to cause the substrate to settle onto and be supported by the pedestal 214.

The cell enclosure 202 comprises a slit valve 209 that comprises slit door 210, a slit opening 212, and a slit door actuator 215. The slit door actuator 215 is connected to the slit door 210. When the slit door actuator is actuated, it can displace the slit door to cover, or be removed from, the slit opening 212. The pedestal 214 comprises a chuck that is capable of supporting and retaining a substrate 216 or 218 during processing. The chuck may be an electrostatic chuck, a vacuum chuck, or any of the types of chucks that are known in the art. The robot 132 comprises a substrate blade 134 that can support substrates (of the type shown as 216 or 218) during transfer. One such substrate blade 134 carrying a substrate can be inserted through slit opening 212 when the slit door 210 is opened. Processing can be performed within the cell 200 upon a single substrate located upon the pedestal 214 when the slit door 210 is closed.

2. Multiple Substrate Lift Device

Embodiments of the first substrate lift 206 are shown in detail in FIGS. 3A, 3B, 4A, 4B, 5, 9A, 9B, 9C, and 10. The structure of one embodiment of the second substrate lift 208 is shown in detail in FIGS. 6A, 6B, and 7. The first substrate lift 206 and the second substrate lift 208 are configured to interoperate to provide the substrate transfer operation. The structure and the operation of the first substrate lift and the second substrate lift are now described.

One embodiment of first substrate lift 206 is shown in different views, and in different positions, in FIGS. 3A, 3B, 4A, and 4B. The first substrate lift 206 comprises a movable lift pin assembly 308 that interacts with a plurality of guide members 310. The movable lift pin assembly 308 comprises a plurality of (e.g. three) support elements 312. Each support element is rigidly connected to a platform element 314. Each support element 312 comprises a support mount 316, a support rod 318, a link support 320, an inverted-T aperture 322 formed in the link support 320, a biased pivoting connection 321 connecting each link support 329 and the platform element 314, and a ramp segment 324.

One guide member 310 interacts with each support element 312.

Portions of the movable lift pin assembly 308 are capable of displacements in two directions by actuation of the first actuator 230. The first actuator 230, when actuated, vertically displaces the platform element 314 and the first substrate lift 206 in a vertical direction. The vertical displacement of the first actuator 230 also laterally displaces the support elements 312 outwardly between the positions shown in FIGS. 3A and 3B. The first actuator 230 typically includes a piston-activated rod 315 extending through a lower wall of the cell, with the actuating portion of the first actuator 230 sealably contained on the outside of the cell to maintain the process conditions inside the cell.

Figure 3A:
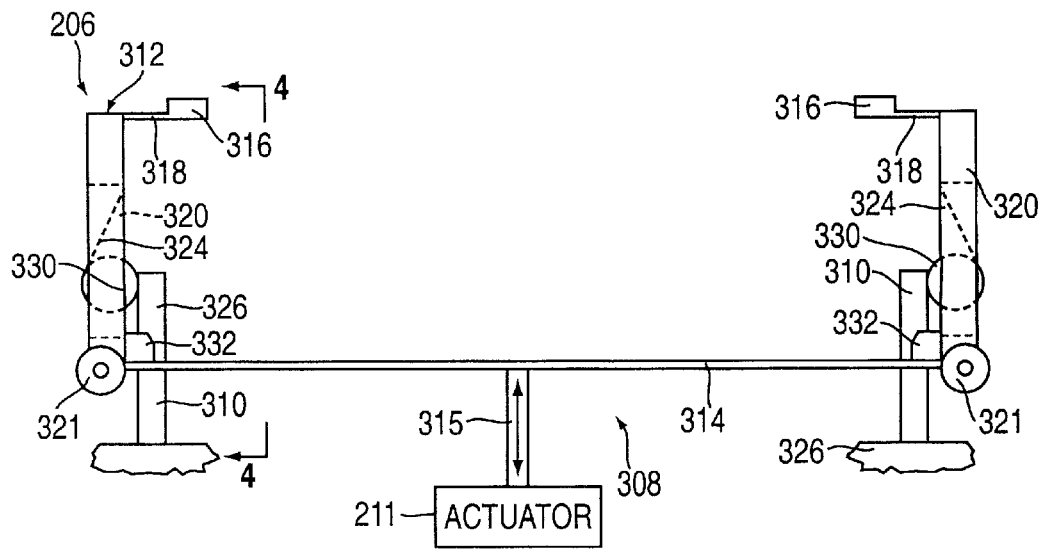
FIGS. 3A and 3B show side cross sectional views of one embodiment of first substrate lift shown in FIG. 2, in FIG. 3A the support elements are in an upright position while in FIG. 3B the support elements of the first substrate lift are in an outwardly displaced position.
Figure 3B:
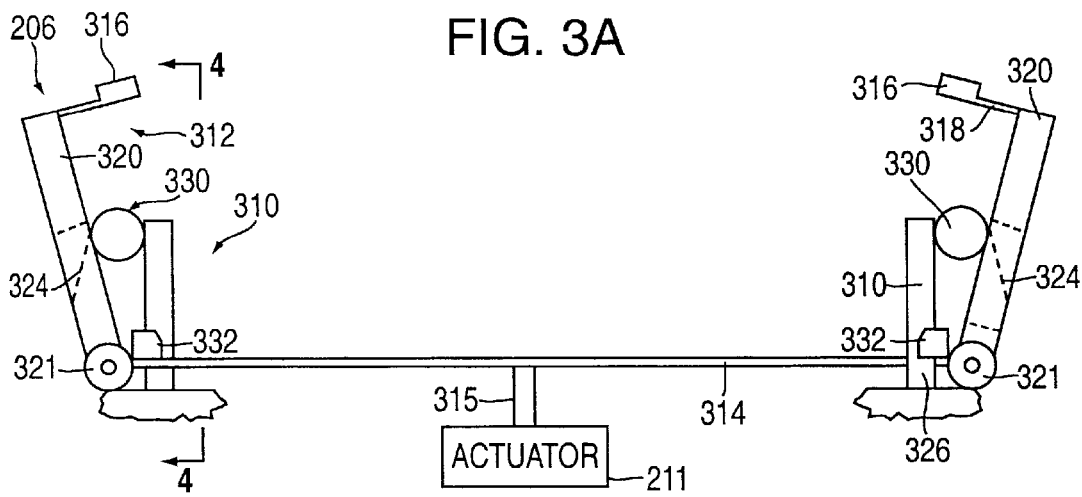

The support element 312 is also capable of rotation about the biased pivoting connection 321 to provide displacement of the support element 312 in the lateral direction. FIG. 3A shows the first substrate lift 206 with the support elements 312 in their upright position. FIG. 3B shows the first substrate lift 206 with the support elements 312 in their outwardly displaced position. During the majority of the operation and displacement of the first substrate lift 206, the support elements 312 remain in their upright positions. When the support elements are upright, they are positioned to support a substrate. The only periods in which the support elements have to be spread out from their upright position are those periods that all of the following three conditions apply:

1) the first substrate lift 206 is being displaced downward;
2) two substrates are positioned in the process cell (typically, one that has been processed and one that is to be processed); and
3) the first substrate lift is positioned within a transverse position. The transverse position of the support elements is any position in which any portion of the support elements, if in their upright positions, would contact any portion of a substrate. Moving the substrate supports 312 into the outwardly displaced position when the first substrate lift is in its transverse position enables the support element 312 (and the connected support rods 318) to pass outside of the outer periphery of the second substrate 218.

The support elements 312 are normally biased by the biased pivoting connection 321 into the upright position.

The support elements 312 bias the link support 320 against a stop member 332 mounted to the platform element 314 (see FIGS. 3A and 3B). The stop member 332 limits excessive inward pivoting of the support element 312 relative to the platform element 314 beyond the position depicted in FIG. 3A. The spring bias of the link support 320 against the stop member 332 can be overcome by the interaction between the biased guide rollers 330 of the guide members 310 and the support elements 312 as now described.

FIG. 14 shows an exploded view of one embodiment of biased pivoting connection 321 that connects one support element 312 to the platform element, and bias the support element into its upright position. The biased pivoting connection 321 comprises a first mounting element 1402, a second mounting member 1404, an interconnecting rod member 406, and a torsional spring element 1408. The first mounting element 1402 includes a first cylindrical portion 1410, a key recess 1412 axially extending within the first cylindrical portion 1410, and a first mounting surface 1414 formed on the first cylindrical portion 1410. The first mounting surface 1414, when assembled, is connected to the support element 312 by a weld, bolt, screw, an adhesive, or other suitable attachment that can be utilized under the process conditions. The interconnecting rod member 1406 comprises a key member 1422 and a rod member 1420 that are rigidly connected and form a unitary structure.

The second cylindrical portion 1404 comprises a second cylindrical portion 1415, a second mounting surface 1419 attached to the second cylindrical portion 1415, a main recess portion 1416 formed in the second cylindrical portion 1415, an alignment aperture 1417 formed in the second cylindrical portion 1415, and a spring mount 1418 contained within the recess portion 1416. The alignment aperture 1417 and the main recess portion 1417 both extend axially of the second cylindrical portion 1415. The main recess portion 1417 is configured to receive the torsional spring element 1408 that extends around the outer periphery of the rod member 1420 of the interconnecting rod member 1406. The second mounting surface 1419 is attached to the platform element 314 by a weld, screw, bolt, an adhesive, or other suitable connection that can withstand the process environment. The main recess portion 1416, the second cylindrical portion 1415, and the alignment aperture 1417 are substantially concentric. When the biased pivoting connection 321 is assembled, the torsional spring element 1408 extends about the rod element 1420, and a first end of the torsional spring element 1408 is non-rotatably connected to the key member 1422. The rod member 1420 extends through the alignment aperture 1417. The second end of the torsional spring element 1408 is non-rotatably connected to the spring mount 1418.

The torsion applied from the torsional spring element 1408 acts to bias the first cylindrical portion 1402 in a rotational direction relative to the second cylindrical portion 1404. This bias is transmitted from the platform element 314 connected to the second mounting surface 1419 to the support element 312 connected to the first mounting surface 1414. In the biased pivoting connection 321 to the left in FIG. 3A, the biasing of the torsional spring element 1408 tends to displace the link support 320 in a first rotational direction. In the biased pivoting connection 321 to the right in FIG. 3A, the biasing of the torsional spring element 1408 tends to displace the link support 320 a second opposed rotational direction.

In an alternate embodiment of support element, not shown, the lower portion of the support element 312 could be constructed of a resilient material to provide a biased pivoting connection 320. The support element 312 is normally upright, but could be displaced outward under biasing conditions into the position shown in FIG. 3B. Any alternative known biasing device using such elements as weights, cams, springs could be used in this application.

Each guide member 310 comprises a support post 326, a biasing guide element 328 (see FIG. 4A), and two biased guide rollers 330. One embodiment of guide member is shown in FIGS. 12 and 13. The guide member 310 also contains a spacing member 1201 that laterally spaces the biased guide rollers 330 from the support post 326 to limit the biased guide rollers contacting the support post as the biased guide rollers are forced together. The biasing guide element 328 comprises two coaxial cylinders 1202, 1204, and a spring member 1206. A recess 1208 extends through the spacing member 1201. One of the guide rollers 330 is attached at one end to each of the coaxial cylinders 1202, 1204. The end of each of the coaxial cylinders 1202, 1204 that are not attached to the guide rollers 330 interfit within the recess 1208. The coaxial cylinder 1202 has a smaller diameter than the coaxial cylinder 1204, and fits therewithin. Detent members limit the outward travel of the coaxial cylinders 1202 out of the recess 1208.

This configuration permits the two coaxial cylinders 1202, 1204 to each slide relative to each other, and to each slide within the recess 1208 formed within the spacing member 1201. A biasing member 1210, such as an axial spring, fits within the interiors of the coaxial cylinders 1202, 1204. The biasing member 1210 biases each of the biased guide rollers 330 apart against the bias applied by the support element 312. The coaxial cylinders 1202, 1204 permit the two biased guide rollers 330 to roll relative to the spacing member 1201 and the support post 326. Though the embodiment in FIGS. 12 and 13 shows two coaxial cylinders that the biased guide rollers 330 are attached to, any suitable configuration in which the guide rollers are biased outwardly while being able to rotate. For example, the biased guide rollers may be offset from each other and mounted in different offset holes, and each guide roller biased with a different spring.

The support post 326 for each guide member 310 is rigidly supported by, and remains stationary relative to, some portion of the cell in which the support post is contained. The biasing guide element 328 biases a pair of biased guide rollers 330 a spaced distance apart in a manner that permits inward retraction of the biased guide rollers 330. The interaction between the guide members 310 and the movable lift pin assembly can force, and displace, the biased guide rollers 330 together or allow the spring bias of the biasing guide element to spread the biased guide rollers apart.

Figure 2A:
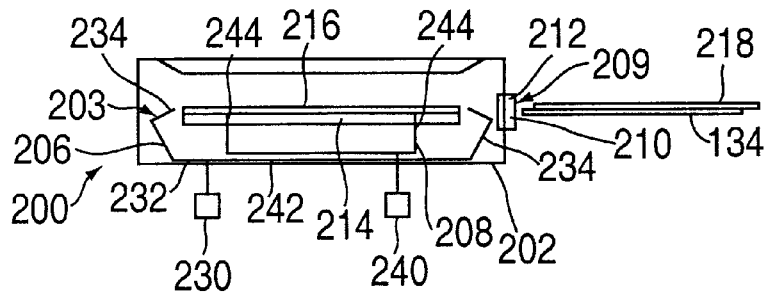
FIGS. 2A to 2N show a progression of side cross-sectional views of a cell including an embodiment of a multiple substrate lift device shown in FIG. 2.
Figure 4B:
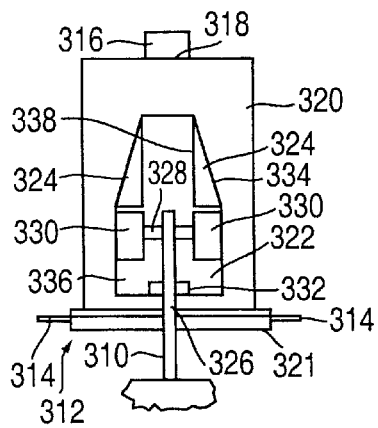
FIG. 4B shows a view of the portion of the first substrate lift taken through sectional lines 4—4 in FIG. 3B.
Figure 4A:
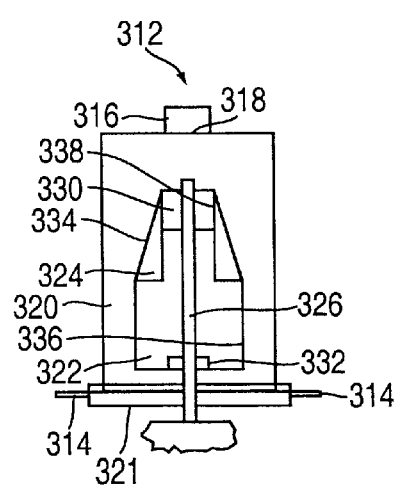
FIG. 4A shows a view of the portion of the first substrate lift taken through sectional lines 4—4 in FIG. 3A.
Figure 8B:
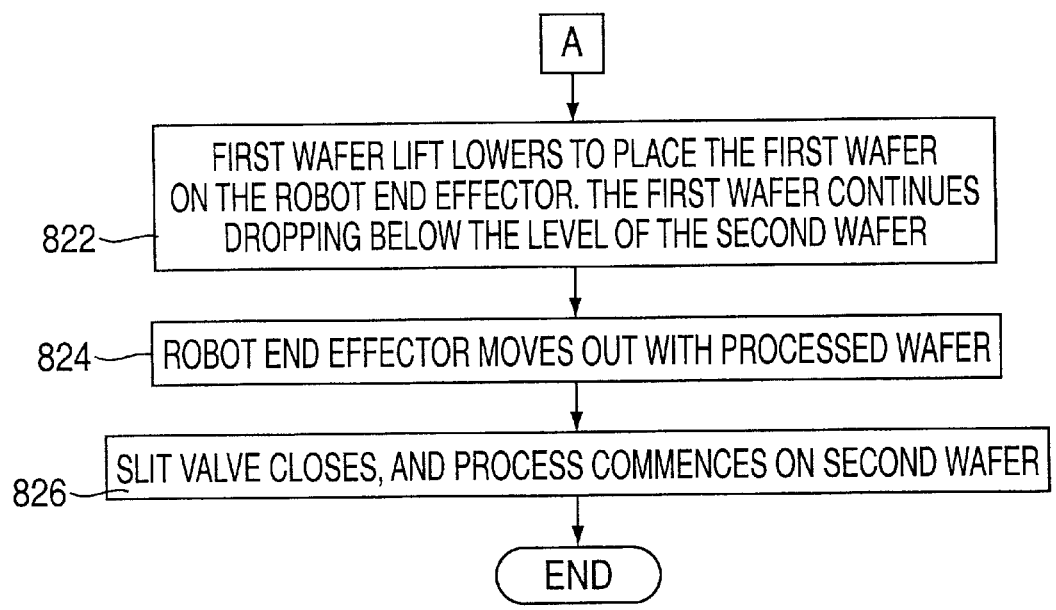
FIGS. 8A and 8B comprise a flow diagram of one embodiment of method to be performed by a controller that is performing the progression depicted in FIGS. 2A to 2N.

FIGS. 3A and 3B should be viewed in combination with their corresponding side view of the support element 312 shown respectively in FIGS. 4A and 4B to observe how the support member is displaced from the upright position to the outwardly displaced position as the support element 312 is moved down relative to the guide members 310. The force that displaces the support element outwardly is imparted by a force generated between the biased guide rollers 330 and the ramp segment 324 as the first substrate lift 206 travels downwardly. The ramp segment 324 is formed from a surface that is angled backward from bending the material of the support element 312 at the ramp bend lines 324 as shown in the embodiment of support element 312 in FIG. 4A. Bending the flap of metal in this manner provides one embodiment of ramp segment 324. Alternatively, the ramp segment 324 can be formed or machined as an integral portion of the support element 312. The ramp segment 324 is positioned to contact the biased guide rollers 330 (to displace the support elements 312 outwardly) only where it is necessary for the support mounts 316 to pass about the periphery of a substrate (as shown in FIG. 2K).

The first substrate lift 206 can be moved independently of the second substrate lift 208. The raising and lowering motions of the first substrate lift 206 are now described according to the results that this motion will have on the support elements 312. Consider the support elements 312 of the first substrate lift 206 to all be upright as the first substrate lift is in its raised position. As the support elements 312 of the first substrate lift are initially displaced downward relative to the guide members 310 into the position shown in FIGS. 3A and 4A, the support elements 312 are maintained upright under the influence of the biased pivoting connections 321. During the initial lowering of the first substrate lift 206, the biased guide rollers are maintained in their outward positions (FIG. 12) within the respective lower side openings of the support elements 312 as the outermost surfaces of the biased guide rollers follow (and/or constrained within) the lower side openings 336 of the inverted-T aperture 322. When the biased guide rollers follow within the lower side openings 336, the guide members 310 do not exert a force against the support elements 312 to displace the support elements into their outwardly displaced positions. The support elements 312 of the first substrate lifts 206 therefore remain upright.

The support elements 312 continue to be maintained in their upright positions until the support elements 312 are downwardly displaced relative to the guide members 310 to the position that the biased guide rollers 330 initially contact bottom surfaces 382 of the ramp segments 324. The biased guide rollers 330 contact and follow the ramp surface 324 (as the support member moves downward relative to the guide rollers 330) to displace the support elements 312 from their upright positions to their outwardly displaced positions. During this downward movement of the support members relative to the biased guide rollers 330, the guide rollers are maintained in contact with, and biased against, the ramp segments 324 within the confines of the ramp bend lines 334.

As the guide rollers are maintained in contact with the ramp segments, each one of the biased guide rollers roll about their respective coaxial cylinders 1202, 1204 shown in FIGS. 12 and 13. The ramp segments 324 have narrower widths near their upper surfaces compared with their lower surfaces. Therefor, the biased guide rollers 330 are forced closer together against the bias of the spring member 1206 of the biasing guide element 328 into the retracted position (as shown in the position of FIG. 4B) as the biased guide rollers 330 travel further up in the ramp segments 324. The biased guide rollers 330 traveling upward relative to, and following, the ramp segments continues to follow the decreasing width of the ramp bend lines 334. The ramp segments force the biased guide rollers closer together until the outer width of the biased guide rollers equals the width of the upper side opening 338.

As the combined width of the biased guide rollers equals the width of the respective upper side openings 338 of the inverted-T apertures 322, no portion of the ramp segments 324 can limit upward displacement of the support elements 312. The biased pivoting connections 321 thereupon force the support elements 312 of the first substrate lift 206 into their upright positions.

During the raising of the support elements 312 relative to the guide members 310 of the first substrate lift 206, the support elements 312 are maintained in their upright positions. Raising the first substrate lift 206 does not result in outward displacement of the support elements 312 into their outwardly-displaced position since the biased guide rollers 324 are constrained within, and follow, the upper side openings 338 of the inverted-T apertures 322. The support elements 312 are maintained in their upright positions by the bias of the biased pivoting connections 321 as the first substrate lift 206 is raised. The inward-biased biased guide rollers 330 will not displace the support elements 312 from their upright positions since the biased guide rollers do not contact the ramp segments 324 as the biased guide rollers are constrained between the upper side openings 338 of the inverted-T apertures 322. The biased guide rollers do not spread apart because they are constrained within the upper side openings 338, and therefore do not contact the ramp segments 324 as the support elements are raised.

The biased guide rollers 330 remains in their retracted positions until the biased guide rollers enter the lower side openings 336 of the inverted-T apertures 322. The biased guide rollers 330 of the first substrate lift 206 are once again biased outwardly into the extended position as shown in FIG. 4B under the influence of the biasing guide elements 336. The biased guide rollers 330 enters the lower side openings 336 as the support elements 312 continued to be raised into their raised positions. When the support elements are in their raised positions, the support elements 312 permit subsequent lowering of the support elements relative to the guide members 310 in which the support elements 312 are outwardly displaced, as described above.

Figure 5:
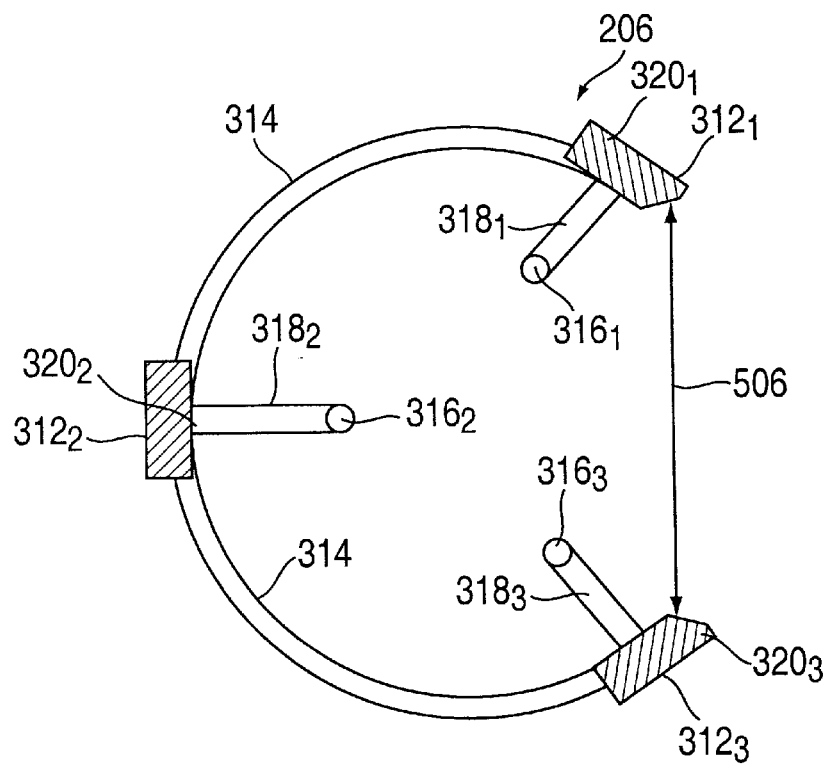
FIG. 5 shows a top perspective view of the first substrate lift shown in FIG. 2.

FIG. 5 shows the first substrate lift 206 with a plurality (preferably three) of support elements $312_1$, $312_2$, and $312_3$. The two support elements $312_1$, and $312_3$ to the right are spaced by a distance shown by the arrow 506. The two support elements $312_1$ and $312_3$ to the right are adjacent to the slit valve 209 of the cell 200 shown in FIG. 2. The distance shown by the arrow 506 is sufficiently wide to allow a substrate to enter (and exit) the cell 209 between the two support elements $312_1$, and $312_3$.

The above first substrate lift 206 is configured such that the support elements $312_1$, $312_2$, and $312_3$ are in the upright position when the support member is raised. When the first substrate lift 206 is displaced from the raised position to the lowered position (during those portions of the travel that the first substrate lift would contact the periphery of a second substrate), the support elements $312_1$, $312_2$, and $312_3$ are outwardly displaced a sufficient distance to pass around the periphery of a substrate without contacting the substrate when. Therefore, the support element is spaced at least a greater distance apart than the diameter of the substrate when the support elements are in their outwardly extended positions. The support elements $312_1$, $312_2$, and $312_3$ are then returned to their upright positions when the support element travels below the level of the second substrate.

When the substrate is raised from the lowered position by the first substrate lift 206, the support elements $312_1$, $312_2$, and $312_3$ are maintained in the upright position so that any substrate contacted by the support mounts 316 of the first substrate lift 206 will be lifted. Any mechanical, electrical, or computer-based system that can provide the following motion is within the intended scope of the first substrate lift 206:

a) the support element is maintained in the upright position when the support element is supporting a first substrate (during both upward and downward travel of the support element within the cell), b) the support element moves from the upright position to the outwardly displaced position during certain segments of downward motion of the support element so the support element passes around, and does not contact, a second 30 substrate, c) the support element then moves back to the upright position as the support mounts 316 of the first substrate lift 206 lowers below the level of the substrate, and d) the support element remains in the upright position as the first substrate lift 206 is raised from the lowered to the raised position of the first substrate lift to lift another substrate.

Another embodiment of the first substrate lift mechanism 206 is depicted in various positions of use in FIGS. 9A, 9B and 9C. The first substrate lift 206 comprises a plurality of guide members 910 and a plurality of support elements 912. Each guide member 910 comprises a post member 914 and a cam member 916. The post member 914 is rigidly affixed to some portion of the cell 200. Each support element 912 comprises support mounts 316 and support rods 318, biased pivoting connection 321 as described above relative to the embodiment shown in FIG. 14, a link support 920, a pivoting cam support 922, a biased pivot 925, a stop member 927, and a cam follower 926. The pivoting cam support 922 is shown in a retracted position by reference character 928.

The first substrate lift mechanism 206 is shown in the raised position in FIG. 9A, with the support elements 912 in their upright positions. As the support elements 912 are displaced downwardly, the pivoting cam supports 922 (that rigidly support their respective cam followers 926) are extended. Therefore, the cam followers 926 follow their respective cam members 916. As the support elements lower relative to the guide members 910, the cam followers follow the cam members 916. Torsional springs (not shown) bias each one of the pivoting cam supports 922 relative to the respective support elements 912 from the retracted positions of the support elements into the extended positions of the pivoting cam supports. The torsional springs bias the pivoting cam supports 922 into the extended positions of the latter, but the stop members 925 limits further over 30 rotation of the pivoting cam supports 922 beyond their extended positions depicted in FIG. 9A.

Further downward motion of the first substrate supports 206 into the position shown in FIG. 9B results in the cam followers 926 engaging their respective cam members 916. The force applied from the cam members 916 to the support elements displace the support elements 912 from their upright positions shown in FIG, 9A into their outwardly displaced position as shown in FIG. 9B. When the support elements 912 are in their outwardly displaced positions, the support mounts 316 for the first substrate lifts 206 are spaced greater distance apart than the outer dimension of a substrate. The downward motion of the first substrate lift 206 results in all of the parts of the support elements of the first substrate lift 206 passing outside of the periphery of a second substrate. When the cam followers 926 pass the apex 9of the cam members 916, the cam followers follow the respective inclined planes 936 resulting in the support elements 912 gradually returning to their upright positions under the biasing influence of the biased pivoting connections 321.

When the first substrate lift 206 is raised from its lowered position to its raised position, the support elements 912 on the first substrate lift are positioned such that they are capable of holding, and raising, a substrate. It is therefore desired to maintain all of the support elements 912 in their upright positions. During upward motion of the support elements 912 relative to their respective guide members 910, the cam followers 926 displace the cam supports 922 into their retracted positions as shown by reference character 928 when the cam followers 926 travels upward along the cam members 916. As such, there is no relative motion between the support mounts 316 of the support elements 912 and any substrate supported thereupon. Therefore, during the entire upward motion, the support elements 912 are maintained in their upright positions. As upward motion of the first substrate lift 206 is commenced, the cam followers 926 follow their respective lands 950 until the cam followers contacts their inclined planes 936.

As the cam followers begin to follow the inclined planes 936, the pivoting cam supports 922 pivot into their retracted positions about their respective biased pivots 925. The cam followers 926 continues to follow their respective inclined planes 936 until the cam followers reach the apex 930, and the pivoting cam supports 922 continue to rotate toward their extended positions depicted as 928 in FIG. 9A. This retracted/extended rotation of the cam followers 936 permit the support elements to remain in their upright positions during the entire upward travel of the first substrate lift. As the cam followers passes the apex 930 and follow the cam members 916, the pivoting cam supports 922 rotate in a counter-clockwise direction as the cam followers 926 follow their respective cam members 916 until the pivoting cam supports 922 are in their extended positions. During the entire upward travel of the first substrate lift 206, the support elements 312 therefore remain in their upright positions while, in downward travel, the support elements 312 are outwardly displaced to avoid contacting another substrate. This last statement is true of the embodiment of first substrate lift 206 shown in FIGS. 3A and 3B.

FIG. 10 shows yet another alternate embodiment of first substrate lift 206. The first substrate lift 206 comprises a platform element 1014 and a plurality of support elements 1012. Each support element comprises a pivot member 1015, a support mount 316, a support rod 318, a support member 1012, and a support element actuator 1016. The pivot members 1015 pivotably connected the support elements 1012 to the platform element 1014. The support element actuators 1016 are connected between the platform element 1014 (or some other suitable location in the first substrate lift to provide the desired rotation of the support element between its extended and retracted positions) and the support elements 1012. Each support element actuator 1016 may be an electromechanically operated device, a piston, a lead screw, a servo-motor, or the like. The controller 136 electronically controls the support element actuators 1016. The support element actuators 1016 are longitudinally extendable to displace their respective support elements 1012 between their upright positions and their outwardly displaced positions. When the plurality of support elements 1012 in the first substrate lift 206 are all positioned in their upright positions, the support mounts 316 are positioned to support a substrate. When the support elements 1012 are positioned in their outwardly displaced positions, the support mounts are positioned so the first substrate lifts 206 can be displaced laterally and pass about the outside of a substrate.

Figure 11:
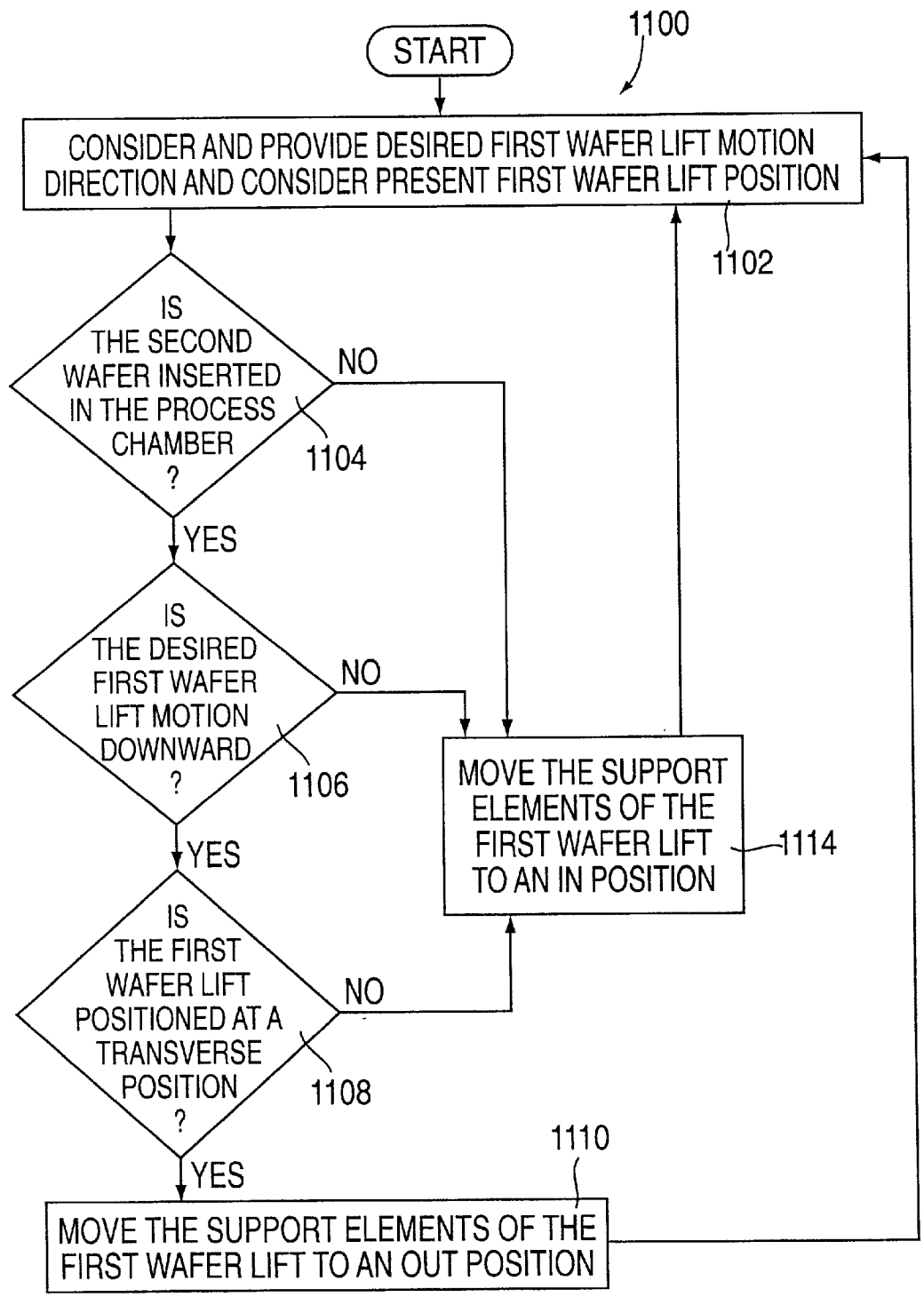
FIG. 11 is one embodiment of software that may be used by a controller during operation of the first substrate lift shown in FIG. 10.

The controller 136 controls the overall operation of the first substrate lift 206 including the support element actuator 1016 and the first actuator 230 (shown in the embodiment in FIG. 2). One embodiment of the software utilized by the controller 136 in controlling the first substrate lift 206 is illustrated in FIG. 11 as method 1100. Method 1100 starts at block 1102 in which the controller receives input either in the form of an execution instruction from another program, or input from the user, indicating the specifics relating to a desired first substrate lift motion. In block 1102, the controller considers the desired first substrate lift motion direction, the present first substrate lift position, and if a second substrate 218 (as shown in FIG. 2F) is located in the cell. The desired first substrate lift motion can be either upward or downward. The present first substrate lift position is either above a transverse position, within the transverse position, or below transverse position. The transverse position is considered a range of vertical height of the first substrate lift in which there is a likelihood that a portion of that first substrate lift 206. The support mounts 316 of the support elements 912 are the elements of the first substrate lift -that will most likely contact a substrate positioned on the pedestal 214 as shown in FIG. 2A.

The method 1100 then continues to block 1104 in which the controller 136 determines if there is a first substrate inserted in the process cell. The logic of block 1104 is that if there is no substrate inserted in the process cell, then there is no necessity to displace the support elements 1012 of the first substrate lift 206 outwardly for the first substrate lift to travel around the first substrate. If the answer to decision block 1104 is no, then the method 1100 continues to block 1114. If the answer to decision block 1104 is yes, then method 1100 continues to decision block 1106.

In decision block 1106, the method 1100 considers if the desired first substrate lift motion is downward. The logic behind decision block 1106 results since outward movement of the support elements 1012 is only necessary during downward travel. The first substrate lift traveling upwards indicates that the second substrate will not have been inserted in the cell since the second substrate is typically inserted in the cell after the first substrate is processed and raised from its pedestal. When the first substrate lift 206 is moving upwards, the support mounts 316 connected to the respective support elements 1012 of the first substrate lift 206 will support any substrate that the support mounts contact. The support mounts 316 connected to the support element 1012 are displaced outwardly to avoid contact with any substrate by actuation of the support element actuator 1016 when the first substrate lift is moving downwards. If the answer to decision block 1106 is no, then the method 1100 continues to block 1114 as described below. If the answer to decision block 1106 is yes, then the method 1100 continues to block 1108.

In decision block 1108, the controller 136 determines if the first substrate lift is positioned at the transverse position. If the first substrate lift is either above or below the level of the transverse position, then no portion of the support elements 1012 (particularly the support mounts 316) will contact with the substrate. Therefore, outward motion of the support elements 1012 of the first substrate lift 206 by actuation of the support element actuator 1016 only become necessary when the first substrate lift is positioned within the transverse position. If the answer to decision block 1108 is no, then the method 1100 continues on to block 1114, as described below. If the answer to decision block is yes, then the method 1100 continues on to block 1110.

In block 1110, the controller 136 moves the support elements 1012 of the first substrate lift to the out positions by actuation of the support element actuator 1016, if the support elements are not already positioned in their or outwardly displaced positions. Following the logic of method 1100, block 1110 is only reached if all of the decision blocks 1104, 1106, and 1108 have affirmative answers. Therefore, block 1110 is only reached if there is a substrate inserted in the process cell, if the desired first substrate lift motion is downward, and if the first substrate lift is positioned at the transverse position. As soon as all of the conditions set forth in decision blocks 1104, 1106, and 1108 are satisfied, then the controller energizes the actuator 1016 to displace, or maintain, the support element 1012 of the first substrate lift 206 outwardly in block 1110.

If the answer to any of the conditions set forth in decision blocks 1104, 1106, or 1108 is not satisfied, then method 1100 continues to block 1114. In block 1114, the controller 136 moves, or maintains, the support elements of the first substrate lift 206 to their in positions by actuation of the support element actuator 1016, if the support elements are not already located in their in positions). Therefore, the support elements 1012 of the first substrate lift 206 is going to be maintained in their in positions during all desired robot motions except when the controller reaches block 1110, as described above.

Following both block 1114 and block 1110, the method 1100 continues to block 1102. In decision blocks 1114 and 1110, the controller makes the desired incremental first substrate lift motion. The desired substrate a first substrate lift motion 1112 in method 1100 is incremental, therefore, method 1100 represents a loop which the controller 136 is continually performing during typical substrate lift motions.

Assume a desired substrate lift motion is downward, the substrate lift is positioned above the transverse position, and a substrate is inserted in the process cell. Under these circumstances, the controller would follow method 1110, and initially follow through block 1102 to decision block 1104. Since there is a substrate inserted in the process cell, the controller would continue to decision block 1106. In decision block 1106, the controller would continue to block 1108 since the desired first substrate lift motion is downward. As soon as the controller is in decision block 1108, a controller would follow to decision block 1114 because the first substrate lift is positioned above the transverse position. A controller will therefore move (or maintain) the support element of the first substrate lift in the in position in block 1114, and continue to block 1112 in which the controller 136 would make the desired second substrate lift motion, which is downward. A controller following method 1110 would then continue to block 1102, and continue the iterative loop through decision blocks 1104, 1106, 1108, and blocks 1114, to block 1102. This loop would continue until the downward motion carried the first substrate lift at or below the transverse position.

When the first substrate lift reaches its transverse position, the controller would proceed to decision block 1108 in method 1100. When decision block 1108 is reached, the method 1100 continues to block 1110 instead of block 1114 as described in the above loop because the first substrate lift is positioned at the transverse position. In block 1110 because the first substrate lift is at the transverse position, the-support element of the first substrate lift would be moved to its out position to avoid contact with a second substrate inserted in the cell. Following the movement of the support elements of the first substrate lift to the out position, the controller 136 will continue following method 1100 to block 1102, in which the controller 136 continues moving the first substrate lift downward.

Following the downward motion of the first substrate lift, the method 1102 would continue the incremental downward motion of the first substrate lift with the support elements 1012 rotated to their out positions by following a loop. The loop includes block 1102, decision block 1104, decision block 1106, decision block 1108, block 1110, and block 1112. Such looping in method 1100 to provide downward motion (with the support elements being located in their out positions) would continue until the downward limit of the transverse position of the first substrate lift has been reached. When the first substrate lift travels below the transverse position, and the method 1100 reaches decision block 1108, the controller continues to block 1114 instead of block 1110. The support elements of the first substrate lift are moved to their in positions in block 1114 by actuation of the support element actuator 1016. The method 1100 continues in a loop defined by decision blocks 1104, 1106, 1108, and blocks 1114 and 1102 until the lower limit of travel of the first substrate lift is reached. The direction of travel of the first substrate lift when the first substrate lift reaches its lowest is reversed to up as the method 1100 reaches decision block 1106.

When the lower limit of desired travel is reached, the controller changes the loop being executed. When decision block 1106 is reached and the first substrate lift is at its lower limit of desired travel, the controller would go to block 1114 because the desired direction of travel is no longer downward. While in block 1114, the support elements would be moved to, and maintained in, their in positions by actuation of the support element actuator 1016. During the time that the lower limit- of travel is reached, as well as when the first substrate lift is moving up, method 1100 loops through decision blocks 1104 and 1106 to blocks 1114 and 1102.

The structure of the second substrate lift 208 is now described relative to the embodiment shown in FIGS. 6A, 6B, and 7. The second substrate lift 200 is configured to interact with the pedestal 214. The pedestal includes a plurality of holes 602, each hole 602 comprises a countersunk head recess 604. The second substrate lift 208 comprises a platform 242 vertically driven by actuator rod 612 and an elongated pin 244 that interfits within each hole. The elongated pins 244 may displace a substrate between the substrates raised and lowered positions. The elongated pins contain a head 616. The head 616 is configured in a generally conical shape to be supported by the countersunk head recess 604 when the elongated pins 244 are in their lowered positions. The actuator rod 612 is typically configured as a piston rod extending through the wall of the cell. The second actuator 240 applies motive force to the platform 242 via the actuating rod 612. The second actuator 240 sealably contained on the outside of the cell to limit exposure of the second actuator to the environment inside the process cell. when the elongated pins 244 are in their raised positions, a substrate is supported by the heads 616 at some prescribed distance above the pedestal 214. When the elongated pins are in their lowered positions, the substrate can rest upon an upper surface 620 of the pedestal.

The platform 242 can be controllable displaced in the vertical direction under the control of the controller 136. When the platform 242 is disposed in the position of FIG. 6A, a space is defined between the platform 242 and the pins 244. The elongated pins 244 are maintained in their lowered positions in which the angled faces of the heads 616 rest in the countersunk head recess 604. When the platform 242 is raised to their positions shown in FIG. 6B, the platform 242 contacts and upwardly displaces the bottom of the elongated pins 244, thereby driving the pins, and any substrate supported on the platform 214, into their raised positions as shown.

The second substrate lift 208 is configured such that the operation of the second substrate lift 208 can occur independently of the operation of the first substrate lift 206. For example, the first substrate lift and the second substrate lifts can be separately raised and lowered as desired.

3. Multiple Substrate Lift Kinematics

The processing of semiconductor substrates in process cells 106 and 108 often requires that a variety of process cells be used sequentially. Certain ones of the process cells configured to perform a variety of processes such as physical vapor deposition (PVD), chemical vapor deposition (CVD), electroplating, and other etching or metal layering processes, etc. Additionally, metrology cells 168 may be utilized by the cluster tool to measure the substrate or structures deposited thereupon. Many sequential robot transfer steps are typically required, which can most efficiently be performed if a robot can switch between the substrate that the robot is supporting, as the multiple substrates are contained within a single cell. The robot transfers and the cell operations are controlled by the controller 136.

Figure 2B:
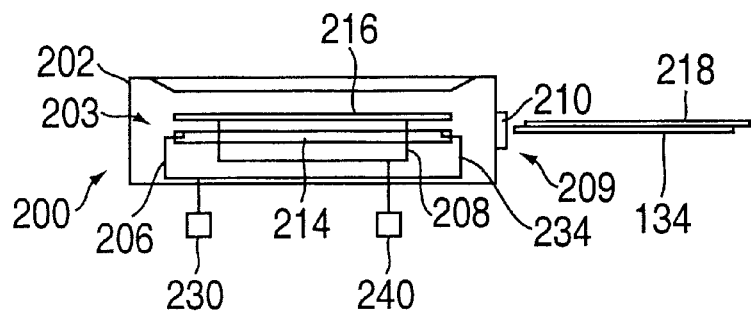
Figure 2C:
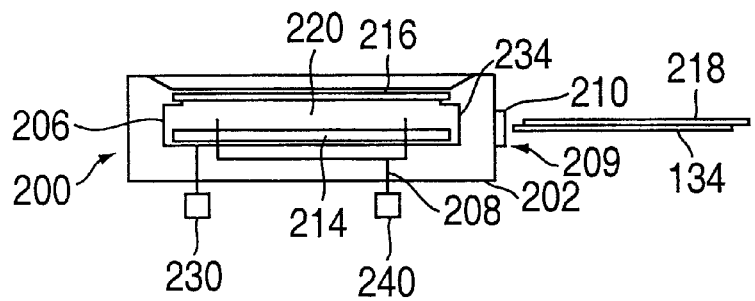
Figure 2D:
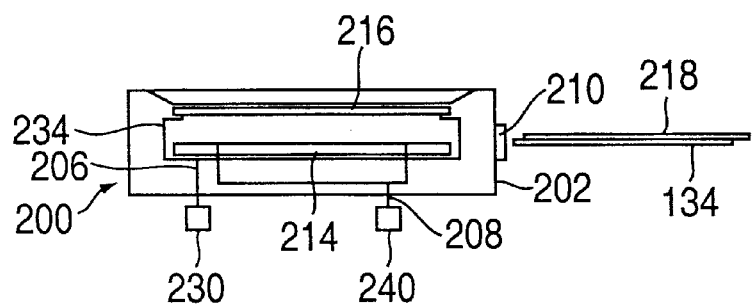
Figure 2E:
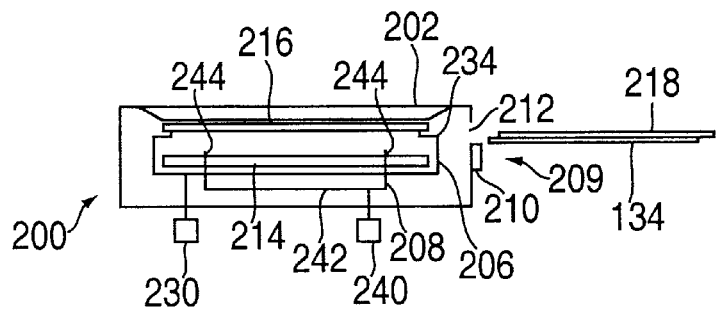
Figure 2F:
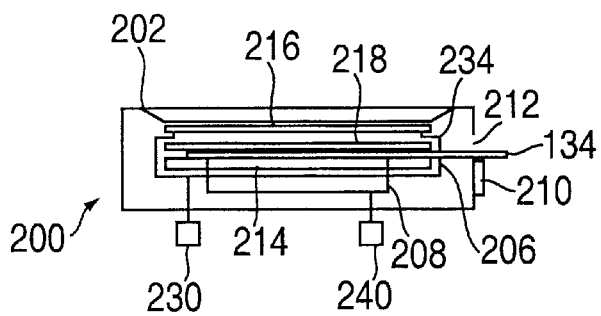
Figure 2G:
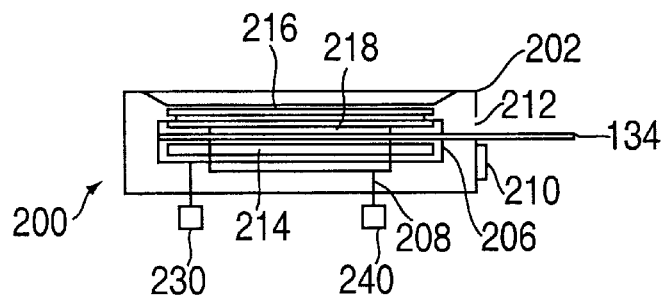
Figure 2H:
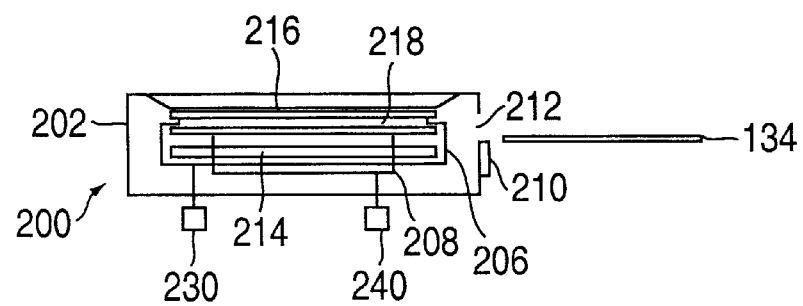
Figure 2I:
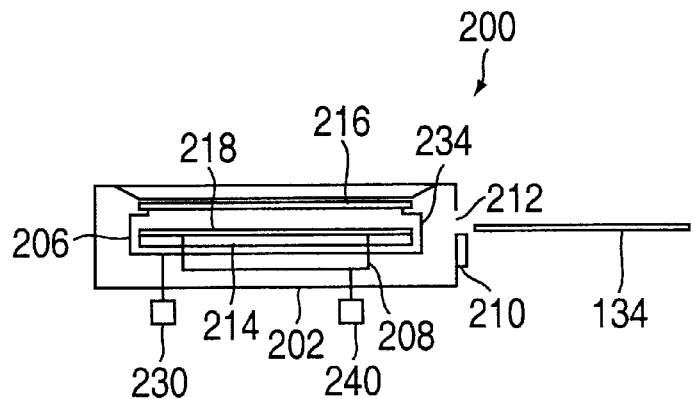
Figure 2J:
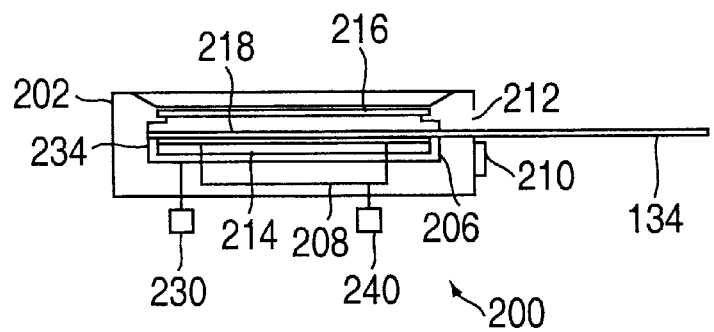
Figure 2K:
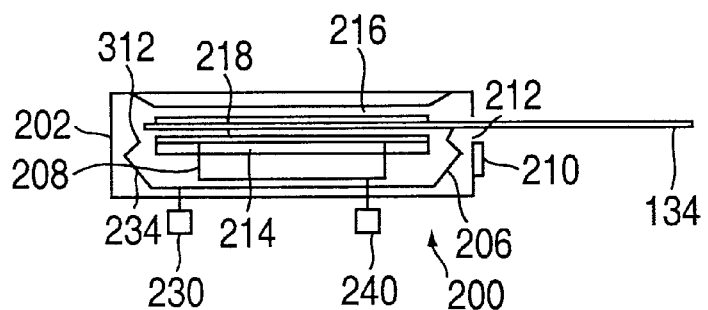
Figure 2L:
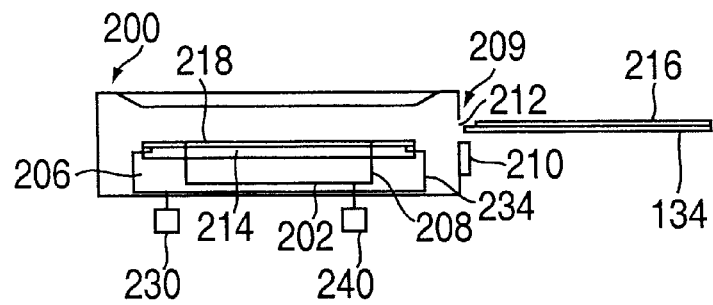
Figure 2M:
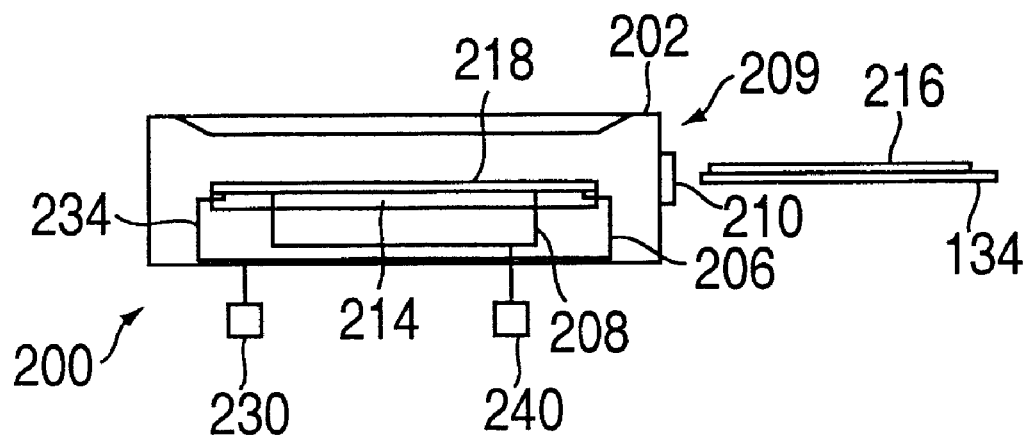
Figure 2N:
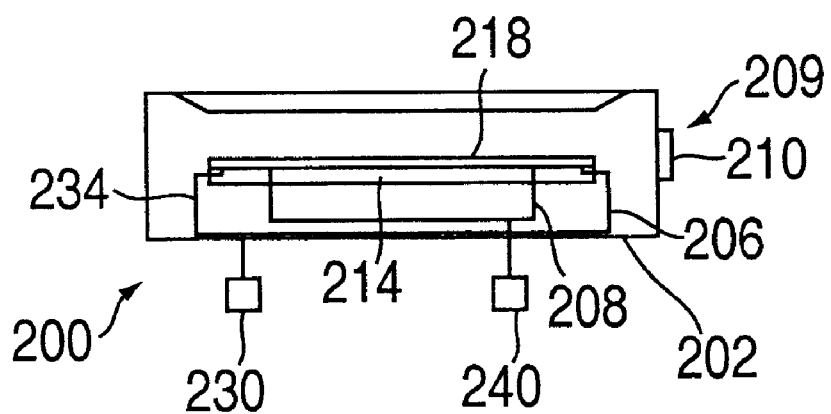

The process depicted in FIGS. 2A to 2N is now described in greater detail. FIG. 2A shows the first substrate 216 after it has just finished its operation (processing) in the cell 200. The first substrate 216 is supported by pedestal 214. The first substrate lift 206 and the second substrate lift 208 are both shown in their lowered retracted positions in FIG. 2A. Neither the first substrate lift 206 (when in its lowered position) nor the second substrate lift 208 (when in its lowered position) contact the substrate 216 when the substrate is supported by the pedestal 214 since the substrate lifts 206, 208 are below the horizontal level of the bottom of the substrate.

In FIG. 2B, the second substrate lift 208 is displaced vertically upwardly. The second substrate lift 208 comes in contact with the first substrate 216, thereby displacing the first substrate vertically upwardly from pedestal 214. The second substrate lift 208 is used to initially separate the substrate 216 from pedestal 214 instead of the first substrate lift 206 because the second substrate lift 208 supports the substrate closer to the center of the substrate. Lifting the substrate using the second substrate lift therefore results in less stress applied to the substrate as the substrate is initially separated from the pedestal. This is important since a considerable force may be necessary to separate the substrate from the pedestal.

After the first substrate 216 has been separated from the pedestal 214 by the second substrate lift 208, then the first substrate lift 206 is moved upwardly to a higher level than the level of the second substrate lift 208, as shown in FIG. 2C. This vertical displacement of the first substrate lift 206 causes the first substrate 216 to be supported only by the first substrate lift 206. After the full upward displacement of the first substrate lift 206, the first substrate 216 is positioned near the top of the cell 200. A space 220 is thus created in the cell at the same horizontal level as the slit opening 212, such that a second substrate 218 can be inserted into the cell at a location below the first substrate 216.

As shown in FIG. 2D, the second substrate lift 208 is then retracted to a vertical level preferably at or below the top of the pedestal 214. While in this position, the second substrate lift 208 does not obstruct the space 220. This retraction thus permits insertion of the second substrate 218 into the interior of the cell 200. To accomplish the insertion of the second substrate into the cell 200, the slit door 210 is removed from the slit opening 212 as shown in FIG. 2E.

As shown in FIG. 2F, the robot blade or end effector 134 that is displaced by, and is a portion of, robot 132 then moves the second substrate 218 horizontally to the left to insert the second substrate into cell 200. The second substrate lift 208 is then moved vertically above the pedestal as shown in FIG. 2G and lifts the second substrate 218 from the robot blade 134. The first substrate 216 is now supported by the first substrate lift 206, and the second substrate 218 is supported by the second substrate lift 208. Removing the second substrate 218 from the robot blade 134 permits the substrate blade 134 to be retracted through the slit opening 212 to outside of the cell 200 as shown in FIG. 2H.

FIG. 2I shows the second substrate lift 208 being moved into its retracted position, wherein the second substrate 218 is supported by pedestal 214. In this position, substrate blade 134 can pass through the slit opening 212, at a horizontal level below the level of the bottom of the first substrate 216, but above the level of the top of the second substrate 218. In FIG. 2K, the first substrate lift 206 is lowered to horizontal level where the first substrate 216 rests upon the robot blade 134. The first substrate lift 206 further retracts below the horizontal level of the second substrate 218, and additionally below the horizontal level of the top of pedestal 214. As shown in FIG. 2L, the robot blade 134 holding the first substrate 216 is then withdrawn through slit opening 212 to outside of the cell 200.

FIG. 2M shows slit cover 210 being moved over, and sealing, the slit opening 212. The robot blade 134 carrying the first substrate 216 can thereupon be moved to further locations for further processing by the robot 132. The cell shown in FIG. 2N is now in the state where it can begin interacting with (e.g. processing, measuring, testing, etc.) the second substrate 218 located therein. After the processing shown in FIG. 2N is completed, then the cycle shown in FIGS. 2A–2N can once again be repeated. In the new cycle, the second substrate 218 becomes the new first substrate 216 shown in FIG. 2, and another (unprocessed) substrate is inserted in the cell as the second substrate 218.

An advantage of this configuration is that it permits multiple substrates to be contained within a single cell as one substrate has completed processing (and is being removed from the cell) and a second substrate is to be inserted in the cell. This swapping of substrates within a single process cell can be accomplished using a single robot blade 134. The substrate transfer mechanism of one embodiment of the present invention, comprising the first substrate lift 206 and second substrate lift 208, is a relatively simple and inexpensive structure.

The controller 136 would perform the method 800, described above. Although the controller 136 is depicted as a general purpose computer that is programmed to perform various scheduling routines, the processes that are implemented by the software can be implemented as hardware as an application specific integrated circuit (ASIC) or as discrete circuit components. As such, the process steps described herein should be broadly interpreted as being equivalently performed by software, hardware, or any combination thereof.

4. Substrate Transfer and Associated Computer Operation

Figures 8, 8A:
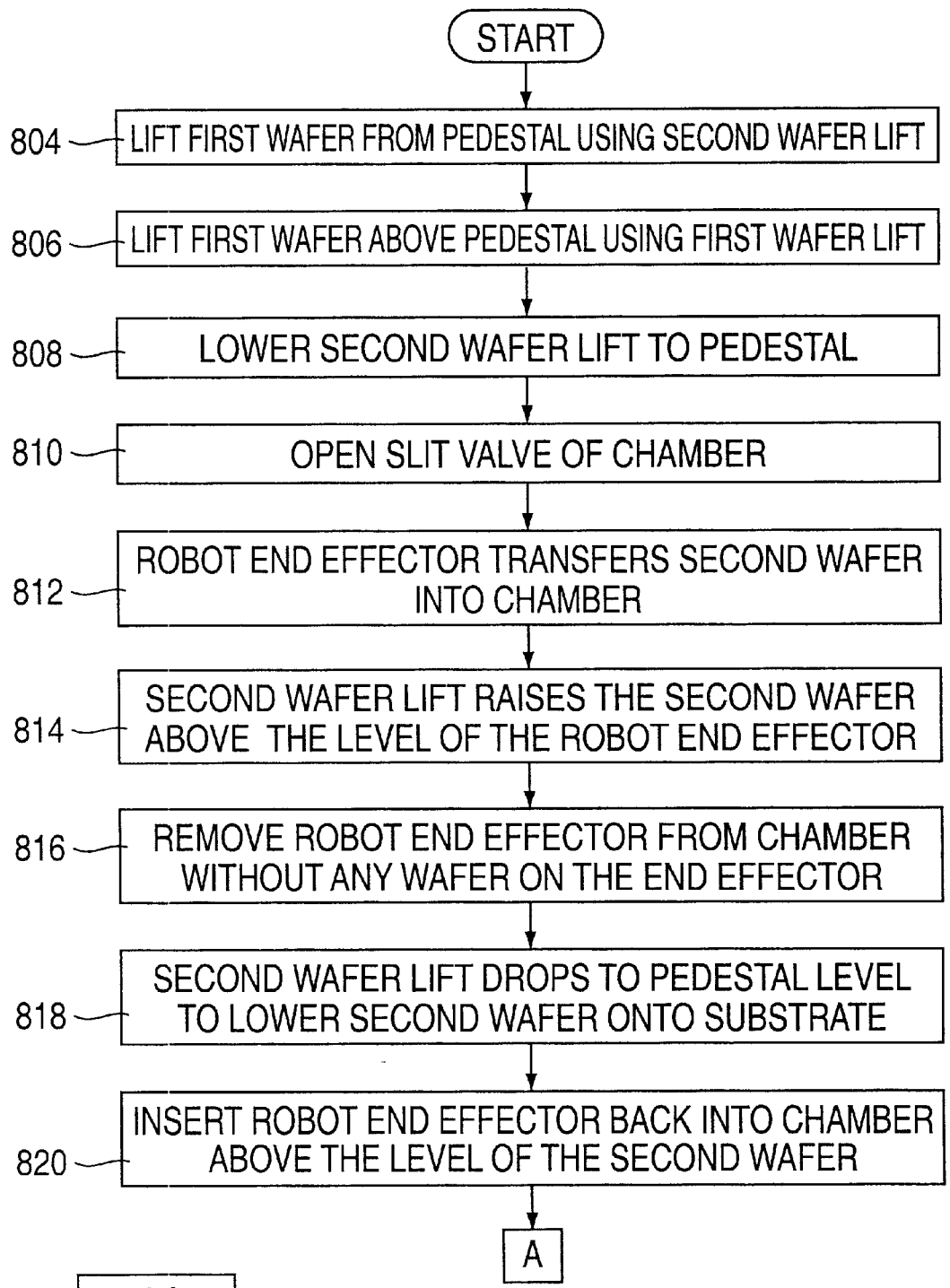

FIG. 8 shows one embodiment of flow chart showing a method 800 in which a pair of substrates that are contained in one cell are swapped within the cell 200 using a single robot end effector 134. Controller 136 performs method 800. Method 800 parallels the schematic physical depiction of the operation of the multiple substrate lift devices 203 in the embodiment of the present invention shown in FIG. 2A to 2N, as described above. As such, FIG. 8 should be viewed and read in conjunction with FIGS. 2A to 2N.

The method 800 commences at block 802, in which the operation (e.g. processing) upon the first substrate 216 to be performed within the cell 200 has just completed. The first substrate is resting upon the pedestal 214 following processing. The cell and the associated substrate lifts are positioned as shown in FIG. 2A.

Blocks 804, 806, 808, and 810 relate to the positioning of the first substrate 216 above the level of the cell, and the positioning of the cell in a position to receive a robot end effector through the slit valve 210. In block 804, the first substrate 216 is lifted by the second substrate lift 208 slightly above the pedestal as indicated in FIG. 2B. The second substrate lift 208 is selected to lift the substrate instead of the first substrate lift 206 because there might be a considerable electric or magnetic attraction between the substrate and the pedestal. The second substrate lift 208 applies its lift pins closer to the center of the substrate than the first substrate lift 206 that applies the lift pins of the first substrate lift closer to the periphery of the substrate. Applying forces through lift pins that are positioned closer to the center of the sides (having a smaller moment applied to the substrate) have less of a tendency to bend, or damage, the substrate than applying forces through the lift pins that are positioned closer to the edges of the sides of the substrate (having a larger moment applied to the substrate).

The method 800 continues to block 806 in which the second substrate lift 208 is raised to lift the first substrate within the cell. The highest level that the first substrate lift 206 can lift a substrate within a cell is above the highest level that the second substrate lift 208 can lift a substrate within the cell. Block 806 is depicted by FIG. 2C. The method 800 continues in block 806 by lowering the second substrate lift 208 within the cell preferably to the level of the pedestal 214, as shown in FIG. 2D.

Method 800 continues to block 810 in which the slit valve 210 is opened. Opening the slit valve provides access by the robot end effector to the cell to release, pick-up, of support a substrate. Block 810 is indicated by FIG. 2E, in which the end effector is shown as 134 while the substrate is shown as 218.

Method 800 continues with blocks 812, 814, and 816 that together insert the second substrate 218 into the cell 200. In block 812, the end effector 134 is displaced by the robot to insert the second substrate 218 into the cell 200. Block corresponds to FIG. 2F. The second substrate 218 is inserted at a level below the level of the first end effector 216. In block 814, corresponding to FIG. 2G, the second substrate lift 208 raises the second substrate above the level of the robot end effector 134. The purpose of block 814 is to raise the second substrate to a position such that the robot end effector can be removed from the cell without sliding the end effector across the surface of the substrate, and probably damaging the delicate components located on the substrate. Method 800 continues to block 816, corresponding to FIG.

2H, in which the robot end effector is removed from the cell without any substrate positioned on the end effector 134. This removal of the end effector permits vertical repositioning of the substrates within the cell.

Method 800 continues to blocks 818, 820, 822, and 824 that together remove the first substrate from the cell. In block 818, that corresponds to FIG. 2I, the second substrate lift 208 drops to position the second substrate on the pedestal. Following block 818, the second substrate 218 will remain in the same position on the pedestal during the processing of the second substrate. In block 820, that corresponds to FIG. 2J, the robot end effector 134 is inserted back into the cell above the level of the second substrate 218, but below the level of the first substrate 216. The end effector 134 is positioned such that the first substrate, when lowered on the first substrate lift 206 by a sufficient distance, will be supported by the end effector 134.

Method 800 continues to block 822, corresponding to FIG. 2J, in which the second substrate is lowered. The lowering process of the first substrate lift continues with the support elements positioned in an upright position capable of supporting the substrate until the substrate is supported by the end effector 134. The first substrate lift is lowered below the level where the first substrate is supported by the end effector. The first substrate lift continues its downward travel until it reaches a level where the support elements 312 of the first substrate lift (for example as shown in FIGS. 4A and 5) have to be displaced outwardly to avoid contact with the second substrate during downward travel.

Any mechanism similar to those described above that provide outward motion of the support element 312 as the first substrate lift travels downward past a substrate supported on a pedestal is within the intended scope of the first substrate lift. After the first substrate lift is below the level of the end effector supporting the second substrate 218, the support elements are then retracted into their upright position using any of the embodiments of first substrate lift (as depicted in FIGS. 4A and 4B, 9A to 9C, and 10).

The method 800 continues to block 824, corresponding to FIG. 2L, in which the first substrate and the supporting end effector 134 is removed from the cell. This is the first instance during the method 800 that the first substrate is removed from the cell. The end effector 134 that initially inserted the second substrate in the cell during block 812 is now being used to remove the first end effector. During this interim period, both the first substrate and the second substrate have been supported by either the end effector, the first substrate lift 206, or the second substrate lift 208.

Method 800 continues with block 826 that corresponds to FIG. 2M, in which the slit valve 210 closes. As soon as the slit valve closes, processing or measuring can commence within the cell (depending upon whether the cell is a process cell or a metrology cell). FIG. 2N indicates the cell 200 having the second substrate processed with the end effector 134 removed for further processing.

Although various embodiments that incorporate the teachings of the present invention have been shown and described in detail herein, those skilled in the art can readily devise many other varied embodiments that still incorporate these teachings.

What is claimed is:

1. An apparatus interacting with a pedestal within a cell, the pedestal is configured to support a single substrate, the apparatus comprising:

a first substrate lift comprising a support element that can be displaced between an upright and an outwardly displaced position, said first substrate lift being capable of displacing a first substrate from the pedestal in a position within the cell that permits a second substrate to be supported relative to the pedestal.

2. The apparatus of in claim 1, wherein the pedestal supports the substrate in an inverted position.

3. The apparatus claim 2, further comprising a second substrate lift, wherein when the first substrate lift is positioned in a first lift lowered level and the second substrate lift is positioned in a second lift lowered level, a substrate can be inserted into the cell and be obstructed by neither the first substrate lift nor the second substrate lift.

4. The apparatus of claim 1, further comprising a second substrate lift, wherein the first substrate can be supported by the first substrate lift and the second substrate can be supported by the second substrate lift.

5. The apparatus of claim 1, wherein the first wafer lift includes a support post that the support element interacts with to displace the support element between the upright and the outwardly displace position.

6. The apparatus of claim 1, wherein the support element comprises a ramp segment and the support post comprises a guide roller, wherein the guide roller is configured to follow the ramp segment.

7. The apparatus of claim 6, wherein the guide rollers are outwardly biased.

8. The apparatus of claim 1, wherein the support element comprises a cam follower and the support post comprises a cam, wherein the cam follower is configured to follow the cam.

9. The apparatus of claim 8, wherein the cam follower is rotatably biased.

10. The apparatus of claim 1, further comprising a support element actuator that can displace the support element between its upright and outwardly displaced positions.

11. A method of transporting a first substrate and a second substrate relative to a cell, the cell contains a pedestal, the pedestal is configured to interact with a single substrate, the method comprising:

moving a first substrate lift from an outwardly displaced position into a position beneath a first substrate;

vertically displacing the first substrate from the pedestal to a remote location; and inserting a second substrate using a robot blade into the cell and onto the pedestal, said second substrate being placed Into contact with the pedestal.

12. The method set forth in claim 11, further comprising removing the first substrate from the cell.

13. The method of in claim 11, wherein the inserting the second substrate onto the pedestal further comprises the steps of:

extending a second substrate lift;

positioning the second substrate on the second substrate lift that supports the second substrate relative to the pedestal; and retracting the robot blade from the cell.

14. The method set forth in claim 13, further comprising retracting the second substrate lift to position the second substrate relative to the pedestal.

15. The method of claim 13, further comprising:

re-extending the robot blade into the cell; and positioning the first substrate on the robot blade.

16. A method of swapping a first substrate and a second substrate within a cell, the method comprising:

inserting the first substrate into the cell, the first substrate being positioned upon a pedestal;

moving a first substrate lift from an outwardly displaced position into a position beneath a first substrate;

vertically displacing the first substrate to a position to permit insertion of the second substrate; and inserting the second substrate into the cell, said second substrate being placed upon a second substrate lift.

17. The method of claim 16, further comprising:

retracting the first substrate from the cell.

18. A computer readable medium that stores software that, when executed by a processor, causes a system to transport a first substrate and a second substrate relative to a pedestal, the pedestal is contained in a cell, the software executed by the processor performs a method comprising:

moving a first substrate lift from an outwardly displaced position into a position beneath the first substrate;

vertically displacing the first substrate from the pedestal to a remote location; and inserting a second substrate using a robot blade into the cell and onto the pedestal.

19. The computer readable medium set forth in claim 18, the method further comprising removing the first substrate from the cell.

20. The computer readable medium set forth in claim 18, the method further comprising inserting the second substrate onto the pedestal further comprising the steps of:

extending a second substrate lift;

positioning the second substrate on the second substrate lift that supports the second substrate relative to the pedestal; and retracting the robot blade from the cell.

\* \* \* \* \*

UNITED STATES PATENT AND TRADEMARK OFFICE
CERTIFICATE OF CORRECTION

PATENT NO. : 6,485,248 B1
DATED : November 26, 2002
INVENTOR(S) : William N. Taylor, Jr.

It is certified that error appears in the above-identified patent and that said Letters Patent is hereby corrected as shown below:

Column 1,
Line 36, please insert -- lift -- after "first substrate".

Column 2,
Line 45, please insert -- position -- after "is in a middle"

Column 6,
Line 4, please change "platform 244" to read -- platform 242 --
Line 41, please change "support 329" to read -- support 320 --

Column 7,
Line 7, beginning with "The transverse position", should be a new paragraph and not part of condition 3) of the paragraph above.
Line 35, please change "406" to -- 1406 --.

Column 11,
Lines 23 and 58, please delete "30"

Column 12,
Line 8, please change "9of" to -- 930 of --

Column 20,
Line 44, please change "placed Into" to -- placed into --

Signed and Sealed this

Twenty-ninth Day of April, 2003

JAMES E. ROGAN
*Director of the United States Patent and Trademark Office*